(12) United States Patent
Guzman-Casillas

(10) Patent No.: US 7,930,117 B2
(45) Date of Patent: Apr. 19, 2011

(54) SYSTEMS AND METHODS FOR POWER SWING AND OUT-OF-STEP DETECTION USING TIME STAMPED DATA

(75) Inventor: Armando Guzman-Casillas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 205 days.

(21) Appl. No.: 12/239,570

(22) Filed: Sep. 26, 2008

(65) Prior Publication Data

US 2009/0089608 A1 Apr. 2, 2009

Related U.S. Application Data

(60) Provisional application No. 60/976,272, filed on Sep. 28, 2007.

(51) Int. Cl.
G01R 19/00 (2006.01)
(52) U.S. Cl. ............................................ 702/60; 702/64
(58) Field of Classification Search .............. 702/57–62, 702/64, 119, 122, 123, 182–185, 125, 186, 702/188, 189, 177, 178; 361/93.2, 85–88, 361/75–80; 307/125, 126, 131, 116; 370/234, 370/252, 503; 324/142, 504, 521, 522, 713, 324/86, 161–163; 700/286, 22, 291–298, 700/21, 108, 109, 287; 340/638, 634, 870.02, 340/657–664, 310.01, 870.01, 870.25, 870.05
See application file for complete search history.

(56) References Cited

U.S. PATENT DOCUMENTS

| | | |
|---|---|---|
| 4,719,469 A | 1/1988 | Beier |
| 4,821,294 A | 4/1989 | Thomas |
| 4,829,298 A | 5/1989 | Fernandes |
| 5,006,846 A | 4/1991 | Granville |
| 5,224,011 A | 6/1993 | Yalla |
| 5,446,682 A | 8/1995 | Janke |

(Continued)

FOREIGN PATENT DOCUMENTS

EP 1324454 7/2003

(Continued)

OTHER PUBLICATIONS

Kim Lab 2.3-Phase Watts, Vars, and Volt-Amperes: In:EECE 324 Energy Conversion Lab Manual (online) 2003 Retrieved Nov. 27, 2008 http://www.hirstbrook.com/energylab/Lab%202.pdf.

(Continued)

*Primary Examiner* — Mohamed Charioui
*Assistant Examiner* — Ricky Ngon
(74) *Attorney, Agent, or Firm* — Stoel Rives, LLP

(57) ABSTRACT

A first intelligent electric device (IED) may be placed at a first location in an electrical power system and a second IED may be placed at a second location in the electrical power system. Voltage measurements may be received from the first and second IEDs. The measurements may be time aligned and used to calculate an angle difference between the first location and the second location in the electrical power system. A slip frequency and acceleration may be derived from the angle difference. The angle difference, slip frequency, and acceleration may be used to detect an out-of-step (OOS) condition in the electrical power system and/or a power swing between the first location and the second location in the electrical power system. The angle difference, slip frequency, and acceleration may also be used to predicatively detect OOS conditions.

65 Claims, 10 Drawing Sheets

U.S. PATENT DOCUMENTS

| | | | |
|---|---|---|---|
| 5,498,956 | A | 3/1996 | Kinney |
| 5,592,393 | A | 1/1997 | Yalla |
| 5,731,943 | A | 3/1998 | Roberts |
| 5,736,961 | A | 4/1998 | Fenton |
| 5,963,582 | A | 10/1999 | Stansell |
| 5,995,911 | A | 11/1999 | Hart |
| 6,075,987 | A | 6/2000 | Camp |
| 6,104,729 | A | 8/2000 | Hellum |
| 6,121,886 | A | 9/2000 | Andersen |
| 6,127,970 | A | 10/2000 | Lin |
| 6,141,196 | A | 10/2000 | Premerlani |
| 6,160,841 | A | 12/2000 | Stansell |
| 6,212,446 | B1 * | 4/2001 | Sato .............................. 700/293 |
| 6,236,949 | B1 | 5/2001 | Hart |
| 6,252,863 | B1 | 6/2001 | Raby |
| 6,313,934 | B1 | 11/2001 | Fortenberry |
| 6,429,785 | B1 | 8/2002 | Griffin |
| 6,446,682 | B1 | 9/2002 | Viken |
| 6,476,521 | B1 | 11/2002 | Lof |
| 6,518,767 | B1 | 2/2003 | Roberts |
| 6,570,534 | B2 | 5/2003 | Cohen |
| 6,603,298 | B2 | 8/2003 | Guzman-Casillas |
| 6,618,648 | B1 | 9/2003 | Shirota |
| 6,642,700 | B2 | 11/2003 | Slade |
| 6,662,124 | B2 | 12/2003 | Schweitzer |
| 6,671,654 | B1 | 12/2003 | Forth |
| 6,687,627 | B1 | 2/2004 | Gunn |
| 6,690,175 | B2 | 2/2004 | Pinzon |
| 6,694,270 | B2 | 2/2004 | Hart |
| 6,735,523 | B1 | 5/2004 | Lin |
| 6,735,535 | B1 | 5/2004 | Kagan |
| 6,745,175 | B2 | 6/2004 | Pierce |
| 6,751,653 | B2 | 6/2004 | Austin |
| 6,754,597 | B2 | 6/2004 | Bertsch |
| 6,762,714 | B2 | 7/2004 | Cohen |
| 6,815,932 | B2 | 11/2004 | Wall |
| 6,833,711 | B1 | 12/2004 | Hou |
| 6,845,301 | B2 | 1/2005 | Hamamatsu |
| 6,845,333 | B2 | 1/2005 | Anderson |
| 6,853,978 | B2 | 2/2005 | Forth |
| 6,859,742 | B2 | 2/2005 | Randall |
| 6,934,654 | B2 | 8/2005 | Benmouyal |
| 6,944,555 | B2 | 9/2005 | Blackett |
| 6,961,753 | B1 | 11/2005 | Osburn |
| 6,983,393 | B2 | 1/2006 | Truchard |
| 7,006,935 | B2 | 2/2006 | Seki |
| 7,096,175 | B2 | 8/2006 | Rehtanz |
| 7,107,162 | B2 * | 9/2006 | Zima et al. ...................... 702/65 |
| 7,248,977 | B2 * | 7/2007 | Hart ................................ 702/62 |
| 7,304,403 | B2 | 12/2007 | Xu |
| 2001/0012984 | A1 | 8/2001 | Adamiak |
| 2003/0200038 | A1 * | 10/2003 | Schweitzer et al. ............ 702/65 |
| 2003/0220752 | A1 | 11/2003 | Hart |
| 2004/0059469 | A1 | 3/2004 | Hart |
| 2004/0093177 | A1 | 5/2004 | Schweitzer |
| 2006/0029105 | A1 | 2/2006 | Kasztenny |
| 2006/0067095 | A1 * | 3/2006 | Hou et al. ...................... 363/78 |
| 2006/0152866 | A1 | 7/2006 | Benmouyal |
| 2006/0224336 | A1 * | 10/2006 | Petras et al. .................... 702/62 |
| 2006/0247874 | A1 | 11/2006 | Premerlani |
| 2006/0259255 | A1 | 11/2006 | Anderson |
| 2007/0086134 | A1 | 4/2007 | Zweigle |

FOREIGN PATENT DOCUMENTS

| | | |
|---|---|---|
| EP | 1324455 | 7/2003 |
| WO | 03055028 | 7/2003 |

OTHER PUBLICATIONS

Zima Special Production Schemes in Electric Power Systems:Literature Survey (online) Jun. 6, 2002 p. 1-22 http://www.eeh.ee.ethz.ch/fileadmin/user_upload/eeh/publications/psl/zima_survey.pdf.

Saman A. Zonouz and William H. Sanders, Information Trust Institute, Coordinated Science Laboratory, and Electrical and Computer Engineering Department University of Illinois at Urbana-Champaign a Kalman-based Coordination for Hierarchial State Estimation: Algorithm and Analysis 2008.

A.P. Sakis Meliopoulos, George J. Cokkinides, Floyd Galvan, Bruce Fardanesh, Georgia Institute of Technology, Entergy Services, Inc and New York Power Authority Distributed State Estimator-Advaces and Demonstration 2008.

Improved Power System Performance through Wide Area Monitoring, Protection, and Control ABB 2004.

Patent Cooperation Treaty; From the International Bureau; Date of Mailing Apr. 2, 2009; PCT/US2007/020277; Notification Concerning Transmittal of International Preliminary Report on Patentability (Chapter I of the Patent Cooperation Treaty); International Filing Date Sep. 19, 2007; Applicant: Schweitzer Engineering Laboratories, Inc.

IEEE Xplore 2.0: Comparative Testing of Sychronized Phasor Measurement Units by Juancarlo Depablos, Virgilo Centeno, Arun G. Phadke and Michael Ingram; http://ieeexplore.ieee.org/spl/freeabs_all.jsp?arnumber=1372972, Jun. 2004.

R.O. Burnett, Jr., M.M. Butts, T.W. Cease, V. Centeno, G. Michel, R. J. Murphy, A. G. Phadke-Synchronized Phasor Measurements of a Power System Event-IEEE Transactions on Powe Aug. 3, 1994 (pp. 1643-1650; vol. 9, No. 3).

Mark Adamiak, Dr. William Premerani, Dr. Bogdan Kasztenny Synchrophasors: Definition, Measurement, and Application-Power Systems 2005 Conference, Marden Center, Clemson University Mar. 8-11, 2005 dated Mar. 11, 2005.

Ragael San Vincente, Raul Cortes, Jaime Robles, J. Enrique Chong-Quero-DSP-Microcontroller Implementations of a Simplified Algorithm for Synchrophasor Calculation-2nd International conference on Electrical Engineering (CIE 2005), Mexico City, Mexico Sep. 7-9, 2005 (pp. 408-411; IEEE Catalog No. 05EX1097.

Tsuyoshi Funaki, Shunsuke Tanaka Error Estimation and Correction of DFT in Synchronized Phasor Measurement-Transmission and Distribution Conference and Exhibition 2002: Asia Pacific, IEEE/PES dated Aug. 6, 2002 (pp. 448-453, vol. 1).

A.G. Phadke Synchronized Phasor Measurements—A Historical Overview-Transmission and Distribution Conference and Exhibition 2002: Asia Pacific, IEEE/PES dated Aug. 6, 2002 (pp. 476-479, vol. 1).

Jian Li, Xiaorong Xie, Jinyu Xiao; Jingtao Wu The Framework and Algorithm of a New Phasor Measurement Unit-2004 IEEE International Conference on Electric Utility Deregulation, Restructuring and Power Technologies (DROT2004) Apr. 2004 Hong Kong dated Apr. 5, 2004 (pp. 826-831, vol. 2).

Yutaka Ota, Hiroyuki Ukai, Koichi Nakamura, Hideki Fujita Evaluation of Stability and Electric Power Quality in Power System by Using Phasor Measurements-Power System Technology, 2000, Proceedings, PowerCon 2000, International Conference dated Dec. 4, 2000 (pp. 1335-1340, vol. 3).

A.G. Phadke Synchronized Phasor Measurements in Power Systems—IEEE Computer Applicatons in Power dated Apr. 1993 (vol. 6).

Gabriel Benmouyal, E.O. Schweitzer, A. Guzman Synchronized Phasor Measurement in Protective Relays for Protection, Control, and Analysis of Electric Power Systems—29th Annual Western Protective Relay Conference Spokane, Washington, Oct. 22-24, 2002 (also available at http://www.selinc.com/techppprs/6139.pdf).

National Instruments Synchronizing and Correlating Measurements to a Global Timebase with GPS; http://zone.ni.com/devzone/cda/tut/p/id/4202 (visited on Sep. 7, 2006).

Enrique Martinez, Nicolas Juarex, Armando Guzman, Greg Zweigle, Jean Leon Using Synchronized Phasor Angle Difference for Wide-Area Protection and Control; www.selinc.com/techpprs/TP6254_UsingSynchronizedPhasor_20060922.pdf dated Sep. 22, 2006.

ABB Wide Area Measurement, Monitoring, Protection and Control Industrial IT for Energy System Operation-http://library.abb.com/GLOBAL/SCOT/scot221.nsf/VerityDisplay/E1755E3F1F32890EC1256E3F0041D8F4/$File/741_PSG_Basic_rev3_A4_US_Ch.pdf (2003).

J. Depablos, Student Member, IEEE, Virginia Tech; V. Centeno, Member IEEE, Virginia Techl; Arun G. Phadke, Life Fellow, IEEE, Virginia Tech, and Michael Ingram, Member, IEEE, Tennessee Valley Authority, Power Engineering Society General Meeting, 2004, IEEE vol. 1, Jun. 6-10, 2004, pp. 948-954.

PCT International Search Report for PCT/US2008/078175, Sep. 12, 2008.
Edmund O. Schweitzer, Timothy T. Newton, Richard A. Baker, Power Swing Relay Also Records Disturbances, 13th Annual Western Protective Relay Conference, Oct. 21, 1986.
ABB: Improved Power System Performance through Wide Area Monitoring, Protection, and Control, 2004.
PCT/US/2008/078018 Patent Cooperation Treaty, International Search Report and Written Opinion, Dec. 3, 2008.

ABB, Wide Area Measurement, Monitoring, Protection and Control, Industrial IT for Energy System Operation, 2003.
Demitrios A. Tziouvaras, Daqing Hou, Out-of-Step Protection Fundamentals and Advancements, 2003.
Tyco Electronics Energy Division, Installation and Operating Instructions R.O.C.O.F. Protection Relay, Nov. 2002.

* cited by examiner

SYSTEMS AND METHODS FOR POWER SWING AND OUT-OF-STEP DETECTION USING TIME STAMPED DATA

RELATED APPLICATIONS

This Application claims priority to U.S. Provisional Application No. 60/976,272, entitled "Systems and Methods for Power Swing and Out-of-Step Detection Using Time Stamped Data" filed Sep. 28, 2007, which is hereby incorporated by reference in its entirety.

TECHNICAL FIELD

This application relates generally to systems and methods for detecting faults in electrical power systems, and more specifically, to systems and methods for detecting power swing and out-of-step conditions in electrical power systems.

BRIEF DESCRIPTION OF THE DRAWINGS

Additional aspects and advantages will be apparent from the following detailed description of preferred embodiments, which proceeds with reference to the accompanying drawings wherein.

DETAILED DESCRIPTION OF PREFERRED EMBODIMENTS

Figure 1:
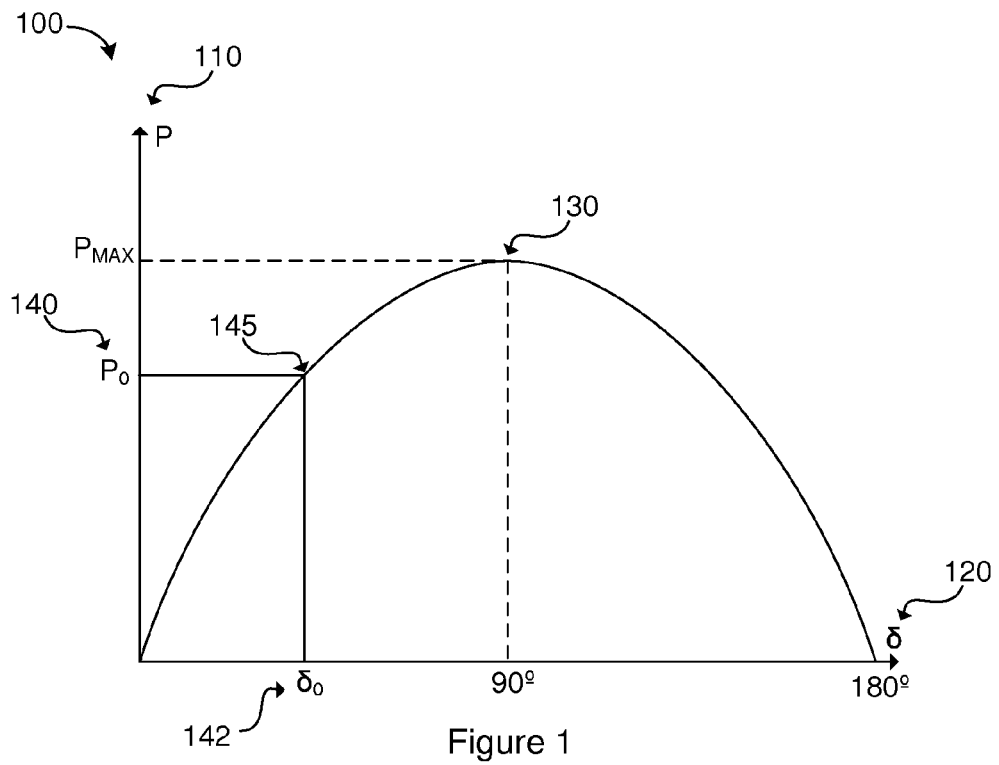
FIG. 1 is a power angle curve showing power transfer between a sending-end generator or generator equivalent and a receiving-end generator or generator equivalent.

Electrical power systems are subjected to a wide variety of disturbances during operation. Small changes in loading conditions occur continually. Larger disturbances in the power system may be caused by events, such as a line fault, loss of a generator, or line switching. The power system should adjust to these changing conditions and/or disturbances and continue to operate satisfactorily within desired bounds of voltage and frequency.

Some disturbances may cause a loss of synchronism between a generator and the rest of the electrical power system and/or between interconnected power systems of connected utilities. In this case, it may be imperative that the generator or other portions of a power system that are operating asynchronously be immediately separated from the rest of the electrical power system to avoid widespread outages and/or equipment damage.

In order to prevent damage to power system equipment and/or prevent outages, an electrical power system may comprise one or more terminal locations adapted to monitor the power system. These devices may monitor the state of the power system and may detect changes in power system stability. In most cases, these devices are microprocessor-based or "intelligent" electronic devices (IEDs). IEDs may include, but are not limited to: protective relays, communications processors, phasor measurement units, phasor measurement and control units, digital fault recorders, and the like.

In a power system steady-state operating condition, there may be an equilibrium between the input mechanical torque and the output electrical torque of each generator in the system. As such, all synchronous machines connected to the power system may operate at substantially the same constant speed. The generator speed governors may maintain the machine speed close to its nominal value. If the system is perturbed, this equilibrium may be upset, resulting in acceleration or deceleration of the rotors of the synchronous machines according to the laws of motion of a rotating body.

If one generator runs faster than another, the angular position of its rotor relative to that of the slower machine (or the rest of the power system) will advance. However, beyond a certain limit to be described below, an increase in angular separation is accompanied by a decrease in power transfer resulting in further angular separation. This will cause the angle between the systems to continue to increase, leading to instability.

During normal operations, a power system may be subjected to different disturbances. Small changes in the loading of the power system take place constantly. The ability of the power system to maintain stability under these small and relatively slow changes in system loading may be referred to as "steady-state stability" and/or "small disturbance rotor-angle stability." Stability systems adapted to handle these small disturbances are generally used to dampen the oscillations caused by these small disturbances. The timeframe of interest of these disturbances is on the order of 10 to 20 seconds.

More severe disturbances may be caused by: power system faults; line switching; generator disconnection; and/or the loss and/or application of large blocks of load. Any of these may cause sudden changes in electrical power flows in the system. Since the mechanical power input to generators producing power for the electrical power system may remain relatively constant, these major system disturbances may cause severe oscillations in machine rotor angles and power flows. So-called "transient stability" or "large disturbance rotor angle stability," refers to the power system's ability to maintain synchronism when subject to large transient disturbances. The timeframe of interest in transient stability may be on the order of 3-5 seconds following a disturbance. These large disturbances may cause a loss of synchronism between one generator and the rest of the power system, or between groups of generators.

In some cases, synchronism may be maintained if unstable portions of the electrical system are separated from the rest of the power system in a timely manner. This separation may be made at points in the power system where a good balance of generation and load exists.

The stability condition of a power system may be characterized by a power angle curve. A power angle curve may be used to depict a relationship between power 'P' transferred between a sending-end of the power system and a receiving-end of the power system relative to an angle difference 'δ' between the sending-end and receiving-end of the power system.

The power P transferred between two sources may be expressed as shown in Equation 1.1:

$$P = \frac{E_S \cdot E_R}{X} \cdot \sin\delta \qquad \text{Eq. 1.1}$$

In Equation 1.1, P is the active power transferred between a source at a sending-end source voltage magnitude $E_S$. $E_R$ represents the receiving-end source voltage magnitude, and δ is the phase angle difference between $E_S$ and $E_R$. In Equation 1.1, X represents the total reactance of the transmission line used to transmit the power P between the sending-end and the receiving-end. As such, X is a sum of the reactance of the sending-end source ($X_S$), the receiving-end source ($X_R$) and the power transmission medium or line ($X_L$). With fixed values for $E_S$, $E_R$, and X, the relationship between P and δ may be plotted as a power angle curve.

FIG. 1 is a graph 100 depicting the effect on the P axis 110 (power transfer axis) of changing values of δ on axis 120. In FIG. 1, δ ranges from 0 to 180° (π). The power transferred between two sources reaches its maximum value $P_{MAX}$ 130 when δ is 90°.

During normal operation, the mechanical power $P_0$ 140 from a generator (e.g., a prime mover) may be converted into a substantially equivalent amount of electrical power, which may be transmitted over a transmission media (e.g., a power transmission line). The angle difference under this balanced normal operation may be $\delta_0$ 142.

Figure 2:
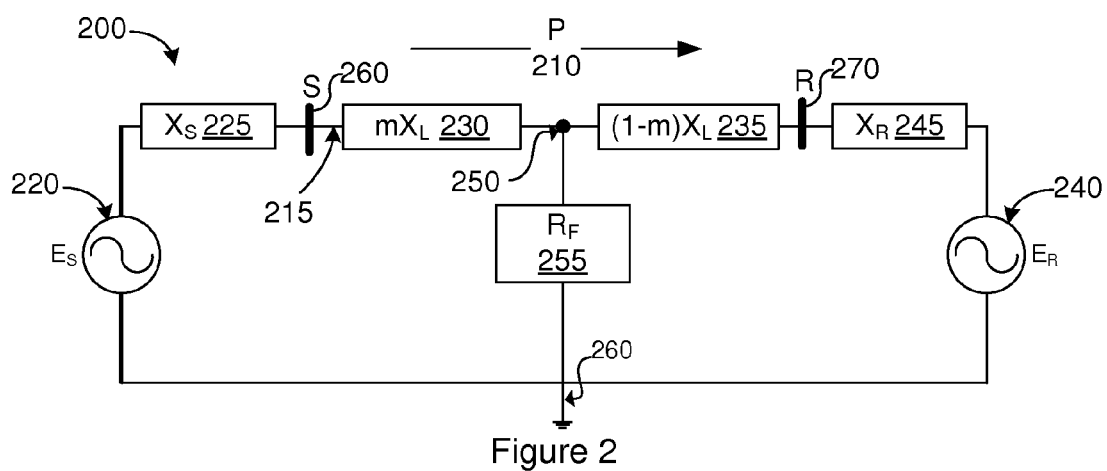
FIG. 2 is a block diagram of a power system comprising a sending-end source and a receiving-end source having a fault therebetween.

FIG. 2 is a block diagram of a power system comprising a sending-end source and a receiving-end source having a fault disposed therebetween. When a fault occurs on a transmission line at a point at distance m 250 between the sending-end source 220 and receiving end source 240, the effective voltages at busbars S and R will drop. The nature of the drop will depend upon the type of fault condition that has occurred. The fault may be modeled as a resistance $R_F$ 255 at point 250.

In FIG. 2, a sending-end source $E_S$ 220 may transfer power 210 to a receiving-end R 270 via a transmission line 215. The sending-end source $E_S$ 220 may have a source reactance $X_S$ 225, and the receiving-end source $E_R$ 240 may have a receiving reactance $X_R$ 245. The transmission line 215 may have a total reactance $X_L$. As such, a fault 250 occurring at a fraction m along transmission line 215 will have reactance $mX_L$ 230 between the sending-end busbar S 260 and the fault location m 250 and reactance $(1-m) X_L$ 235 between the fault location 250 and the receiving-end busbar R 270.

Various types of faults 250 may occur in the power system segment 200 including, but not limited to: a fault between one or more phases and ground fault; a single line-to-ground fault; line-to-line fault; double-line-to-ground fault; and a three-phase fault.

In general, single line-to-ground faults may have the minimum impact on the equivalent transmission reactance among the various fault types, while a three-phase fault may block all power transmission between the sending-end busbar S 260 and receiving-end busbar R 270.

A fault in the power system 200 may be transient, such that the faulted transmission line may go back into service after a short time (e.g., after a trip and reclose sequence of a protective relay or the like). As such, the power angle curve may have a pre-fault, fault, and a post-fault state. These states may vary depending upon the fault type.

Figure 3:
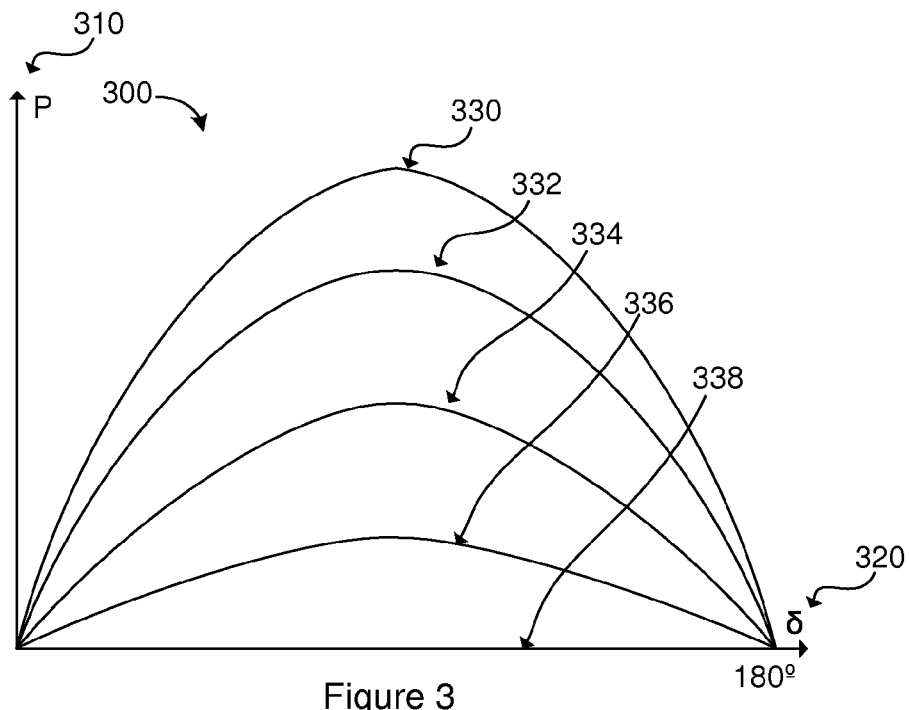
FIG. 3 illustrates power angle curves resulting from various power system fault conditions.

FIG. 3 depicts various power angle curves 300 occurring in a power system under pre-fault, fault, and post-fault states for various fault types. In the FIG. 3 embodiment, the P axis 310 may represent the power transferred from a sending-end source to a receiving end-source, and the δ axis 320 may represent the phase angle difference between the respective sources. A power curve 330 may represent a no-fault power transfer curve of the system. As such, curve 330 may represent the no fault power curve of the system (e.g., the pre-fault and post-fault power curve). Under a fault condition, the power transferred between the sending-end and receiving-end sources may be reduced. The power angle curve 332 may represent a single-line-to-ground fault power angle curve in a system where a single phase of a three-phase signal faults to ground. A line-to-line fault may produce power angle curve 334, and a line-line-to-ground fault (where two phases fault to ground) may produce power angle curve 336. A three-phase fault (all phases faulted to ground) may prevent any power transmission in the system and may be represented by a "flat line" power angle curve 338.

As discussed above, during normal operation, the output of electrical power from a generator may produce an electric torque that balances the mechanical torque applied to the generator input rotor shaft. As such, the generator may run at a constant speed within the balance of electric and mechanical torques. When a fault reduces the amount of power transmitted between the generator and the rest of the power system (as in the power curves 332, 334, 336, and 338 depicted in FIG. 3), the electric torque countering the input mechanical torque on the generator may also be decreased. If the mechanical power is not similarly reduced during the fault period, the generator may accelerate, which will increase the phase angle divergence between the generator and the rest of the electrical power system.

As discussed above, a power system may return to its pre-fault power transfer condition after the fault has been cleared from the system. This may allow the power system to return to stability if the system is properly damped. Such a system may be referred to as transiently stable. However, in some instances, even after the fault is cleared, the angle difference may continue to increase. Such a system may be referred to as transiently unstable.

Figure 4:
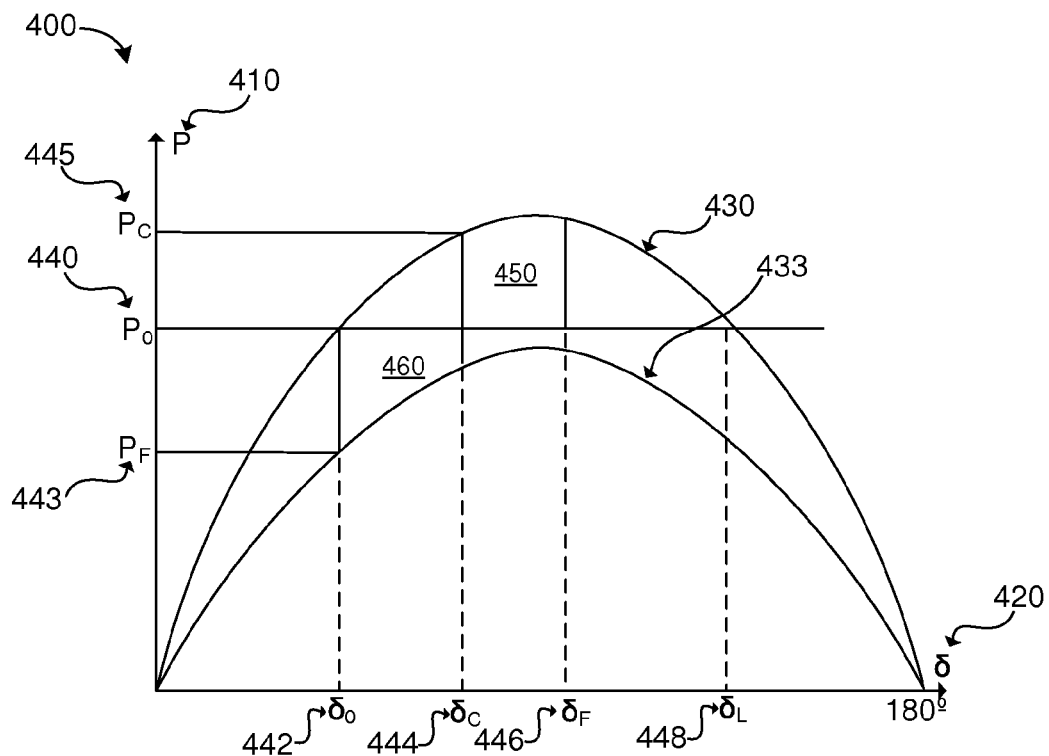
FIG. 4 depicts exemplary pre-fault, post-fault, and fault power angle curves for a transiently stable power system.

Turning now to FIG. 4, pre-fault, fault, and post fault power angle curves 400 of a transiently stable system are depicted. As discussed above, a two-source power system transfers power between a sending-end and receiving-end according to a pre-fault or no-fault power transfer curve 430. The power system may operate at an angle difference balance point $\delta_0$ 442, resulting in a power transfer between the sending-end generator and receiving end generator of $P_0$ 440. After a fault, the power transferred by the system may decrease in conformity to power angle curve 433. As discussed above, the nature of the power angle curve 433 may depend upon the topology of the power system and/or the nature of the fault (e.g., the type of fault that has occurred in the system, such as a single line-to-ground, line-to-line, etc.). As shown in power angle curve 433, the fault condition may decrease the power transferred between the sending-end source and receiving end-source to point $P_F$ 443.

As discussed above, the power transfer decrease from $P_0$ 440 to $P_F$ 443 may cause the sending-end generator to accelerate due to the reduced output electrical torque acting on the rotor. This may, in turn, cause the angle difference between the sending-end source and the receiving-end source to increase.

At the time the fault is cleared from the system, the angle difference between the sending-end and receiving-end may reach $\delta_C$ 444. Clearing the fault may increase the power transfer back to the power angle curve characterized by pre-fault power angle 430. The increase in power transferred between the sending-end and receiving-end may create a decelerating torque acting on the sending-end generator rotor. This decelerating torque may be generated since the power output $P_C$ 445 at the angle $\delta_C$ 444 is greater than the mechanical power $P_0$ 440 input to the generator.

The sending-end generator, however, may not return to the nominal $\delta_0$ 442 immediately, due in part, to the inertia of the generator rotor system. The sending-end generator inertia may cause the angle difference to increase to $\delta_F$ 446. At this point, the energy lost during deceleration (e.g., the area defined by 450) may be substantially equal to the area gained during acceleration (e.g., the area defined by 460). This may be referred to as the equal-area criterion of the system.

In FIG. 4, if the angle difference $\delta_F$ 446 is smaller than $\delta_L$ 448, the system may be transiently stable. As such, with sufficient damping, the angle difference $\delta$ between the sending-end and receiving-end busbars may eventually settle back to the original balance point at $\delta_0$ 442.

However, if the energy lost in deceleration (e.g., area 450) is smaller than the energy gained by acceleration (e.g., area 460) at the time the angle difference reaches $\delta_L$ 448, the system may be transiently unstable. The instability may be created since further increase in angle difference $\delta$ between the sending-end and the receiving-end may result in an electric power output that is less than the mechanical power input. As such, the sending-end generator rotor may continue to accelerate, and the angle difference $\delta$ will continue to increase beyond recovery. This is a transiently unstable scenario.

Figure 5:
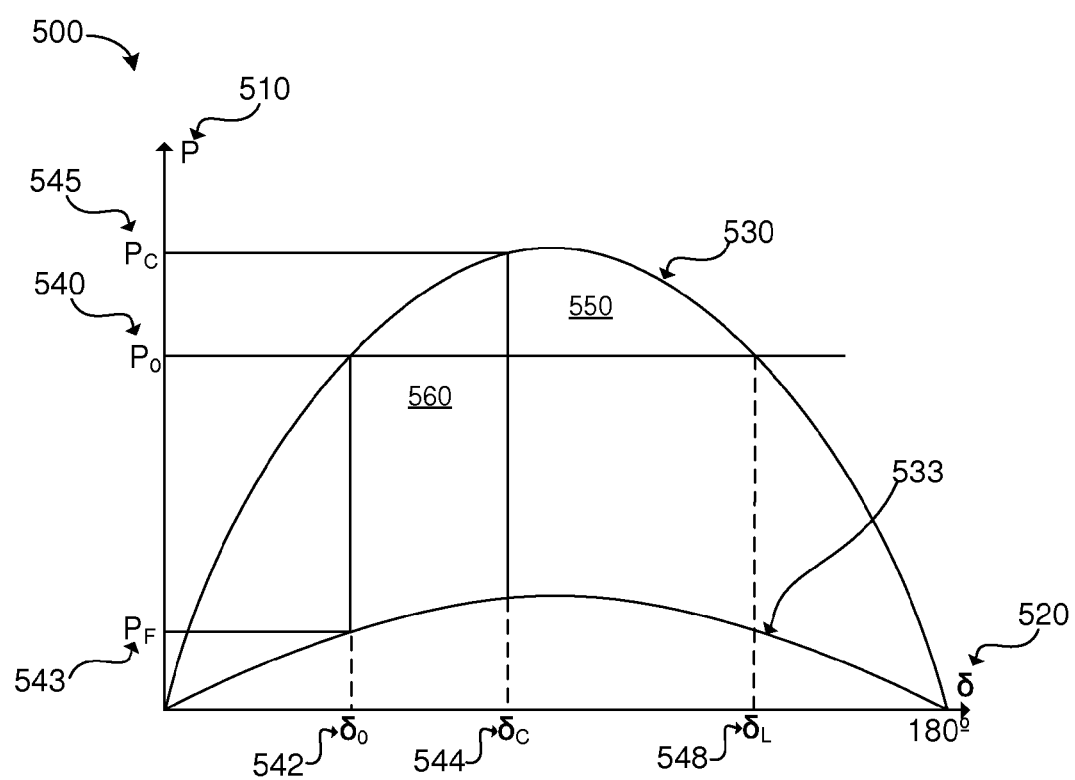
FIG. 5 depicts exemplary pre-fault, post-fault, and fault power angle curves for a transiently unstable power system.

FIG. 5 depicts one embodiment of no-fault and fault power angle curves 500 in a transiently unstable scenario. In the embodiment of FIG. 5, the sending-end generator of the system may rotate at a speed that is different from the receiving-end equivalent generator. Such a condition may be referred to as a loss of synchronism and/or an out-of-step condition.

The power system modeled by power angle curves 500 may have a no-fault power angle curve 530 at an angle difference balance point at $\delta_0$ 542. A fault in the system may modify the power angle curve to 533. The reduced power transfer may cause the sending-end generator and/or sending-end equivalent generator to increase its rotation speed to compensate for the difference between input power $P_0$ 540 and the power transfer of power curve 533. By the time the fault is cleared, the angle difference may have increased to $\delta_C$ 544. The energy added to the system may be represented by area 560. After clearing the fault, the energy transferred between the sending-end and receiving-end generators may again resemble power curve 530. The increased power transfer may create a decelerating force on the sending-end generator and/or equivalent generator. The decelerating energy may be represented by area 550. However, since the energy input into the system during the fault condition 560 is greater than the deceleration energy 550, the angle difference will not return to $\delta_0$ 542 before the angle difference reaches $\delta_L$ 548. At $\delta_L$ 548, the decelerating force produced by the increased output electrical torque on the sending-end generator and/or generator equivalent may be reduced and/or removed. This is because further increase in angle difference $\delta$ decreases the power transfer compared to the input mechanical torque $P_0$ 540, causing the angle difference $\delta$ to increase beyond recovery.

As shown in FIGS. 4 and 5, the response of a power system to a disturbance and/or fault may depend on both the initial operating state of the system (e.g., the power angle curve, $P_0$, $\delta_0$, and the like), the severity of the disturbance, and the time required to clear the fault. A fault followed by timely isolation by protective relays may cause variations in power flows, network bus voltages, and machine/generator rotor speeds. These variations may actuate generator voltage regulators and/or actuate prime mover governors.

Depending on the severity of the disturbance, the system may remain stable and return to an equilibrium state. As discussed above and depicted in FIG. 4, this may be referred to as a transiently stable system and/or a stable power swing. If the system is transiently unstable (as depicted in FIG. 5), a large separation of generator rotor angles may result, creating large swings in power flows, large fluctuations of voltages and currents, and eventually lead to a loss of synchronism between groups of generators or between neighboring utility systems.

During unstable power fluctuations, there may be a large variation of voltages and currents throughout the power system. When two areas of a power system are in phase, the currents are at a minimum. Conversely, when the two areas of a power system are 180° out-of-phase, the currents are at a maximum.

These fluctuations may be modeled as a change in apparent impedance seen by a relay positioned at the sending-end. Accordingly, one traditional approach to detect power swings and/or out-of-step (OOS) conditions measures the impedance seen by a relay at the sending-end generator (or sending-end generator equivalent).

Under this impedance trajectory approach, a Clarke Diagram may be constructed to show a load impedance trajectory, $Z_\lambda$, in a two-generator and/or generator equivalent system having a power transfer ratio of, $$\left|\frac{E_S}{E_R}\right| = 1.1$$

and angle offset $\delta$. The line IEDs may include an OOS element that uses local information to monitor the impedance trajectory for discrimination between power swings and fault conditions. When an OOS element detects a power swing condition, it may block any distance elements. In this model, the OOS element requires that the apparent impedance enter dedicated impedance characteristics before an OOS condition is detected.

However, since timing is critical in detecting and dealing with power swing and/or OOS events, it would be desirable to detect power swings before the apparent impedance enters the OOS impedance characteristic.

In another approach, an IED may determine the angle difference $\delta$ between sending-end and receiving-end generators and/or generator equivalents. The angle difference $\delta$ may be determined from voltage measurements obtained by IEDs at particular locations in the power system (e.g., at the sending-end and receiving-end of the power system). In some embodiments, positive sequence voltages and/or alpha-Clarke components may be derived from the voltage measurements. Systems and methods for calculating a positive sequence voltage given a three-phase voltage measurement are well known in the art. An alpha-Clarke component of such a voltage measurement may be calculated per equation 1.2 below:

$$V_\alpha = \frac{2}{3}\left(V_A - \frac{V_B + V_C}{2}\right) \quad \text{Eq. 1.2}$$

In Equation 1.2, $V_\alpha$ may represent an alpha-Clarke component, and the voltages $V_A$, $V_B$, and $V_C$ may represent the phases of a three-phase voltage signal.

This approach may require that the positive-sequence voltages and/or alpha-Clarke components be estimated so that a first and second derivative of the angle difference δ may be calculated. Such estimation relies on network parameters and topology. This may be problematic, since network topology may change as the power system reacts and adapts to changing power system demands. Additionally, power system segments may have to be quickly reconfigured responsive to fault conditions. As such, solutions relying on particular network topologies and/or parameters may not be feasible in a real-world application and/or may be less desirable than an approach that may detect OOS conditions independently of a particular power system configuration.

Another, more effective approach detects power swings by calculating an angle difference δ between a sending-end and a receiving-end of the power system. Using the angle difference δ, a slip frequency $S_F$, and acceleration $A_F$ may be calculated. These values may be derived from local and remote voltage measurements. The slip frequency $S_F$ frequency may be calculated per Equation 1.3:

$$S_F = \frac{\partial \delta}{\partial t} \quad \text{Eq. 1.3}$$

In Equation 1.3, δ may be the angle difference δ between the local and remote voltage measurements, and t may represent time. In another embodiment, where discrete sample measurements are used, the slip frequency $S_F$ may be approximated by Equation 1.4:

$$S_F = \frac{1}{\Delta t}(\delta_t - \delta_{t-1}) \quad \text{Eq. 1.4}$$

In Equation 1.4, $\delta_t$ may represent an angle difference δ calculated using voltage measurements obtained at a sampling time t, and $\delta_{t-1}$ may represent a difference measurement corresponding to the previous sampling time. The difference between sampling intervals is Δt.

The acceleration $A_F$ may be derived from the slip frequency $S_F$ as shown in Equation 1.5:

$$A_F = \frac{\partial S_F}{\partial t} \quad \text{Eq. 1.5}$$

In a system using discrete samples of voltage, positive sequence voltage, and/or alpha-Clarke components to calculate the angle difference δ and $S_F$, the acceleration $A_F$ may be estimated per Equation 1.6:

$$A_F = \frac{1}{\Delta t}(S_{Ft} - S_{F(t-1)}) \quad \text{Eq. 1.6}$$

The accuracy of the values of δ, and the resulting slip frequency $S_F$, and acceleration $A_F$ depends upon time synchronization between the local and remote voltage measurements. As discussed above, a three-phase power system may comprise three separate voltage signals having a substantially similar magnitude and phase offset of substantially 120°. The signals may oscillate at the same frequency, typically 60 Hz. As such, any delay in communicating measurements between the remote and local IED may result in a potentially significant phase error. The phase error may be proportional to the operating frequency. Accordingly, the error introduced by time delay may be expressed as shown in Equations 2.3 and 2.4 below:

$$V_R = r \cdot \sin(2\pi f t + \theta) \quad \text{Eq. 2.3}$$

$$V_{R\_DLY} = r \cdot \sin(2\pi f t + \theta + 2\pi f \tau) \quad \text{Eq. 2.4}$$

In Equation 2.3, t may represent time, and f may represent the frequency of a component of a three-phase voltage $V_R$ measurement obtained at a remote IED. Theta (θ) may represent the phase offset of the component. Equation 2.4 may represent a measurement of $V_{R\_DLY}$ transmitted over a communications channel having a delay tau (τ). As discussed above, the delay τ may introduce a phase error into the measurement that may be proportional to the frequency of the measured current $V_R$, in equation 2.4 this error may be represented by $2\pi f \tau$.

Although various techniques have been employed to reduce and/or compensate for the delay τ in the communications channel, such techniques are not completely effective and some unaccounted-for delay may remain. For example, a "ping-pong" technique may be used to estimate the communications delay between terminals. In this technique, the round-trip communications delay is measured, and the corresponding one-way communications delay is estimated as one-half (½) the total roundtrip delay. However, this technique is not effective in systems having an asymmetrical and/or variable communications delay, since the one-way delay may not consistently be half the total delay. For example, Synchronous Optical Network (SONET) systems in common use introduce an asymmetrical communication delay. As such, the resulting one-way estimate may not accurately reflect the delay in the system.

Moreover, the communications delay may be variable and, as such, may not be properly compensated for a priori. For example, many communications systems, such as Internet Protocol (IP), have variable routing channels. Use of various routes for communications may introduce variable delay into the system. In addition, variable communication delay may be introduced by other factors, such as the loading on the communications network, or the like that are impossible to accurately predict.

The phase angle error introduced by asymmetrical and/or variable communication delay may introduce an error into the calculation of the angle difference δ, slip frequency $S_F$, and acceleration $A_F$. This error may preclude the use of certain efficient and effective power swing and OOS detection techniques that use these values.

The communication delay error may be addressed by adding time stamping information to the remote and/or local voltage measurements. The time stamp information may allow a receiver of the measurements (e.g., an IED) to time align the measurements to thereby accurately determine power system properties therefrom (e.g., δ, $S_F$, $A_F$, and the like).

Figure 6:
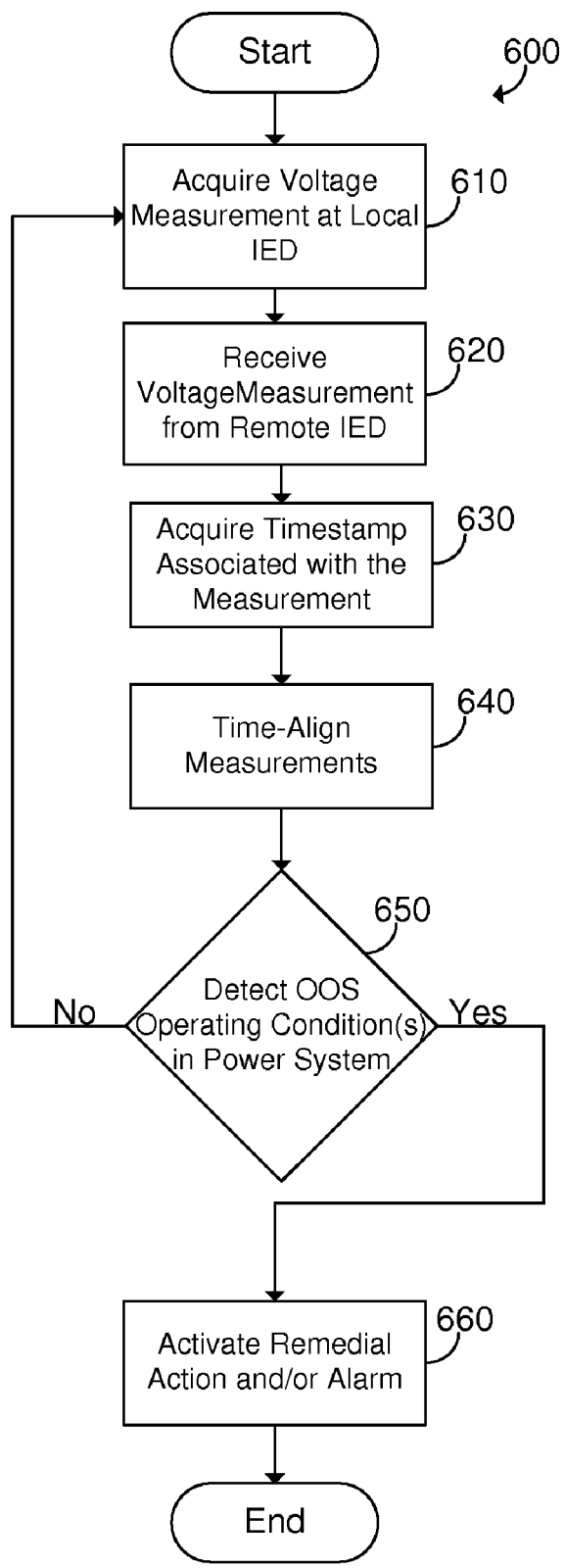
FIG. 6 is a flow diagram of one embodiment of a method for detecting power swing and out-of-step conditions in a power system using time stamped voltage measurements.

FIG. 6 depicts an embodiment of a process 600 for detecting a power swing, OOS condition, and/or another operating condition of a power system under the teachings of this disclosure.

At step 610, a voltage measurement at a first, local IED may be obtained. The local IED may be configured to periodically obtain voltage measurements from a location in the power system. The location may correspond to a sending-end and/or receiving-end of the power system. Since the voltage measurement of step 610 may be obtained locally at the first IED, there may be little or no delay in communicating the measurement to process 600. However, any such delay may be measurable and/or relatively constant. Accordingly, process 600 may be capable of reliably compensating the local delay. Alternatively, process 600 may not be near the first, local IED. As such, the process 600 may be unable to reliably compensate for communications delay. In this case, the voltage measurement may comprise a time stamp or other data to allow process 600 to time align the measurement.

At step 620, a voltage measurement from a second, remote IED may be received by process 600. The measurement of step 620 may have been transmitted over a communications interface, such as a SONET network, an IP network, or the like. As discussed above, the communications infrastructure may introduce an asynchronous and/or variable communications delay into process 600, such that it may be impossible to determine when the measurement of step 620 was obtained and/or transmitted.

At step 630, a time stamp associated with the voltage measurements of steps 610 and/or 620 may be acquired. The time stamp information may be included in the message received at 610 and/or 620 or may be received in a separate message. The time stamp may allow process 600 to determine the time the measurement of steps 610 and/or 620 was obtained at the first or second IED, respectively.

At step 640, the voltage measurement obtained at step 610 may be time aligned with the voltage measurement of step 620. As used herein, time alignment may refer to modifying the phase and/or magnitude of the measurements of steps 610 and 620, shifting a sequence of measurements, or the like.

Figure 8:
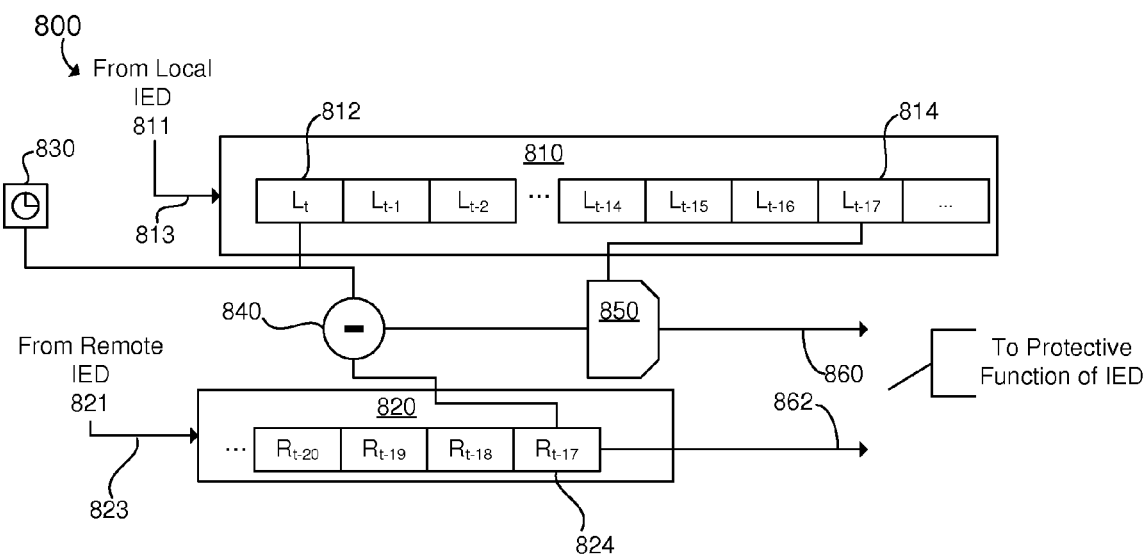
FIG. 8 is a block diagram of one embodiment of a time alignment system.

In one embodiment, time alignment may comprise delaying a locally obtained measurement of step 610 relative to a remote measurement received at step 620. In this case, each measurement may be time stamped relative to a common time reference standard (e.g., a time standard shared by the local and remote IEDs and/or process 600). The common time reference may be any time reference shared by the local and remote relays, such as an absolute time that can be provided by a global positioning system (GPS); a common time provided by a GPS; NIST time signals carried on radio waves, such as WWV or WWVB; common time provided by a high accuracy clock, such as a cesium clock, an atomic clock, or the like. The time alignment may comprise delaying and/or buffering a voltage measurement to align measurements having the same time stamp. One embodiment of such an alignment technique is depicted in FIG. 8, which is described in detail below.

In other embodiments, time alignment may comprise modifying a phase and/or magnitude of the measurements of 610 and/or 620 to conform to a common time reference. In this embodiment, the measurements of 610 and 620 may comprise a synchrophasor according to the teachings of United States Patent Application Pub. No. 2007/0086134, entitled, "Apparatus and Method for Estimating Synchronized Phasors at Predetermined Times Referenced to an Absolute Time Standard in an Electrical System" to Zweigle et al., which is hereby incorporated by reference in its entirety. In this embodiment, voltage measurements may be made according to a common time reference. The phase angle and/or magnitude of the measurements may be modified to conform to a sampling time defined on the common time reference. As such, time alignment may comprise generating synchrophasor measurements at step 610 and 620 and time aligning the measurements as described in Zweigle et al.

Alternatively, the time stamping and/or time alignment may be performed using the techniques and methods described in U.S. Pat. No. 6,662,124 entitled, "Protective Relay with Synchronized Phasor Measurement Capability for Use in Electric Power Systems," to Schweitzer, III et al.; and/or U.S. Pat. No. 6,845,333 entitled, "Protective Relay with Synchronized Phasor Measurement Capability for Use in Electric Power Systems," to Anderson et al., each of which is hereby incorporated by reference in its entirety.

In another embodiment, the measurements of the first and second IEDs may be obtained according to a measurement interval defined on a common time reference. Each measurement may comprise a reference to a measurement sequence number and/or a measurement offset from the measurement interval. As such, time alignment may comprise matching measurements having the same measurement interval sequence number and/or offset. Such matching may comprise buffering the measurement and/or referencing the measurements in a random or sequential access memory storage location.

At step 650, one or more operating conditions of the power system segment between the first IED and second IED may be determined. The operating condition may correspond to power swing detection, predictive OOS detection, OOS detection, or the like. The operating condition may be determined using the angle difference δ between a local and remote IED. As discussed above, a slip frequency $S_F$, and acceleration $A_F$ may be derived from the angle difference δ. Embodiments of systems to perform power swing detection, predictive OOS detection, and OOS detection using these values are discussed below. The voltage measurement of step 610 and 620 may be in analog or digital format. If in digital format, the operating condition detecting of step 650 may be performed in a digital processor, such as a general purpose processor, an application specific integrated circuit (ASIC), ROM, field programmable gate array (FPGA), or the like. Measurements in analog form may be converted to digital using an analog to digital converter (AD), or, alternatively, may be processed in their analog form using analog circuitry (e.g., analog comparators and the like).

If the operating conditions are not satisfied, the flow may continue to step 610 where process 600 may continue monitoring the system. Otherwise, the flow may continue to step 660.

At step 660, process 600 may assert a trip signal indicating the fault and/or detected condition of the power system and/or issue an alarm. For example, if a power swing is detected, a power swing detection indicator may be asserted. If an OOS condition is detected, additional actions may be taken at step 660 including, but not limited to, disconnecting the power system segment from the rest of the power network, taking protective actions to prevent damage to the power system apparatuses and network, and the like. It should be understood that upon detecting a particular power system condition an IED may programmatically respond in any number of ways. As such, this disclosure should not be read as limited to any particular protection and/or fault mitigation technique and/or methodology. The method then returns to step 610 to continue monitoring the power system.

Figure 7:
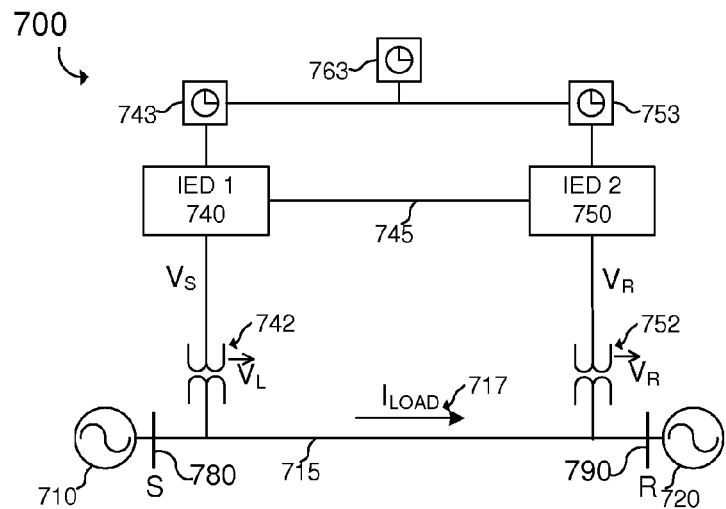
FIG. 7 is one embodiment of an electrical power system comprising a first intelligent electronic device (IED) and second IED.

Turning now to FIG. 7, one embodiment of a power system segment 700 defined by a first IED 740 and second IED 750 is depicted. A power transmission medium 715 may allow a current $I_{Load}$ 717 to flow within the segment defined by IEDs 740, 750. The current $I_{Load}$ 717 may be driven by a sending-end generator and/or generator equivalent 710 and consumed and/or transmitted to a receiving-end generator and/or equivalent 720.

The current $I_{Load}$ 717 may comprise a three-phase current driven by a three-phase voltage signal. Accordingly, current $I_{Load}$ 717 may be comprised of a set of three currents, namely $I_{LA}$, $I_{LB}$, and $I_{LC}$, each comprising a sine wave signal of substantially the same magnitude 'r' with a phase offset of substantially 120° or $$\frac{2}{3}\pi$$

between each phase component during balanced condition operation. The phase currents may be driven by three-phase voltage signal $V_L$ comprised of three-phase voltage signals, $V_{LA}$, $V_{LB}$, and $V_{LC}$. Alternatively, the voltage signal may include a positive-sequence voltage $V_{S1}$ (as expressed in equation 2.8) or an alpha-cCarke component of voltage. Accordingly, the phase voltage signal $V_L$ on transmission medium 715 may be expressed per Equations 2.5-2.8, in which f represents the frequency of the voltage signal and t represents time:

$$V_{LA} \text{ may be expressed as } r \cdot \sin(2\pi f t) \qquad \text{Eq. 2.5}$$

$$V_{LB} \text{ may be expressed as } r \cdot \sin\left(2\pi f t + \frac{2}{3}\pi\right), \text{ and} \qquad \text{Eq. 2.6}$$

$$V_{LC} \text{ may be expressed as } r \cdot \sin\left(2\pi f t + \frac{4}{3}\pi\right). \qquad \text{Eq. 2.7}$$

$$V_{S1} = V_{SA} + \alpha V_{SB} + \alpha^2 V_{SC} \qquad \text{Eq. 2.8}$$

IED one 740 may be communicatively coupled to a phase voltage sensor 742. The phase voltage sensor 742 may be configured to obtain phase voltage measurements at a sending-end busbar S 780 of the electrical power system 700.

IED two 750 may be communicatively coupled to a phase voltage sensor 752. The phase voltage sensor 752 may be configured to obtain phase voltage measurements at busbar R 790 of the electrical power system 700.

As discussed above, the phase voltage measurements obtained by sensors 742, 752 may comprise measurements of one or more phases of a three-phase current and/or voltage signal. For example, one or more phase of a three-phase current 717 may be obtained. Using the three-phase measurements, symmetrical components of the current 717 may be determined.

IED one 740 may be configured to transmit the voltage measurements obtained by sensor 742 to IED two 750 via a communications channel 745. The communications channel 745 may comprise any communications transmission system known in the art including, but not limited to: an IP network, a SONET network, a wireless network, a radio network, a cellular network, or the like.

The measurements from IED one 740 to IED two 750 may comprise a time stamp generated by a clock 743. The clock 743 may be in communication with a common time reference signal source 763. The common time reference source 763 may allow the clock 743 of IED one 740 to be time-synchronized with a clock 753 of IED two 750. The time stamp may be generated in any form known in the art, including a Universal Coordinated Time stamp (UTC), Unix time stamp, an offset time, or the like. Alternatively, IED one 740 may be configured to conform its measurement time and/or the phase and/or magnitude of voltage measurements to a measurement time determined by clock 743.

In a similar embodiment, the common time signal reference may be provided by one of the IEDs. For example, IED one 740 may include a clock 743 that generates a common time reference signal to IED two 750. In this embodiment, the clock 743 may comprise a high-accuracy clock, such as a cesium clock. In this embodiment, interruption of communication with the common time reference source 763 would have a minimum effect in the accuracy of the time stamps applied by IEDs one or two 740, 750.

Similarly, IED two 750 may be configured to transmit voltage measurements obtained via sensor 752 to IED one 740 via communications channel 745. IED two 750 may be configured to include a time stamp with the measurements transmitted to IED one 740 using timer 753 coordinated to common time reference 763. Alternatively, IED two 750 may be configured to conform its measurement time and/or the phase and/or magnitude of phasor measurements to a measurement time determined by timer 753.

Since the voltage phasor measurements transmitted between IED one 740 and IED two 750 comprise time stamp information corresponding to a common time reference 763, IED one 740 may be capable of time aligning the phasor measurements received from IED two 750 over communications channel 745 and vice versa. This may allow IED one 740 and IED two 750 to use the time aligned phasor measurements to detect power swings and/or OOS conditions in the power system segment 700.

Turning now to FIG. 8, one embodiment of system 800 for time aligning phasor measurements made on a local IED with measurements transmitted from a remote IED is depicted. Phasor measurements made locally may be received by time alignment system 800 via connection 811. As discussed above, the phasor measurement 813 received on connection 811 may comprise a three-phase signal measurement, a measurement of a single phase of a three-phase signal, and/or a component of a symmetrical component derived from a three-phase signal (e.g., a symmetrical component, alpha-Clarke component, or the like). The local phasor measurement 813 received via connection 811 may also comprise a time stamp referenced to a common time reference.

The local phasor measurement 813 received on connection 811 may be stored in a memory storage module 810. The memory storage module 810 may comprise a random access memory, shift register, first-in-first-out (FIFO) or any other data storage and/or buffering mechanism known in the art. In the embodiment of FIG. 8, the memory storage module 810 may comprise a random access FIFO.

The local phasor measurements may be stored in the memory storage module 810 in the order they are obtained. For example, a measurement obtained at the current time t may be stored in a memory storage location 812. Measurements occurring earlier in time may be shifted to the right within the memory storage module 810. For example, the memory storage location directly to the right of location 812 may contain the proceeding measurement obtained at t−1. The memory storage module 810 may comprise as many memory storage locations as needed to time align local and remote phasor measurements. As such, if measurements are obtained at a measurement frequency $f_S$, and the communications delay between the local and remote IED varies with a maximum delay of Δ, the memory storage module 810 may accommodate at least ($f_S$*Δ) storage locations for the local and remote phasor measurements.

The system 800 may comprise a memory storage module 820 to buffer incoming phasor measurements 823 received from a remote IED (not shown). These remote measurements 823 may have been obtained at a remote IED in communication with the local IED over a communications interface 821. The communications interface 821 may comprise any communications interface known in the art including, but not limited to: a SONET network, an IP network, a cellular network, a radio network, or the like. Since the remote measurements 823 may be delayed relative to the local phasor measurements 813 stored in the memory storage module 810, no buffer 820 may be needed. In other embodiments, the incoming remote measurements 823 may be buffered for performance reasons and/or to handle delay occurring in obtaining local measurements.

The phasor measurements obtained at the local IED may comprise a time stamp corresponding to a common time reference 830. Time standard 830 may allow the local and remote IED to generate synchronized time stamp information. In the embodiment of FIG. 8, a time standard 830 may be used to time stamp local measurement 813 as it is stored in the memory storage module 810.

A comparator 840 may determine a time difference between a local measurement 813 stored in storage location 812 of the memory storage module 810 and a remote measurement stored in storage location 824 of memory storage 820. For example, in the depiction of FIG. 8, the time difference is seventeen (17) measurement samples.

The differential output of the comparator 840 may be passed to a selector 850. The selector 850 may comprise a multiplexer, addresser, or any other component capable of determining an offset and/or address into memory storage 810 given a measurement offset calculated by the comparator 840. In the example depicted in FIG. 8, the selector 850 may select the local measurement stored in memory storage location 814 of memory storage module 810 having a measurement offset of seventeen (17).

The output 860 of the selector 850 may be passed to a local power system characteristic module as a local phasor measurement, and the output 862 of memory storage 820 may be passed to a local power local characteristic function as a remote phasor measurement. The measurements of 860 and 862 may be time aligned, allowing the characteristic module to operate properly.

Figure 9:
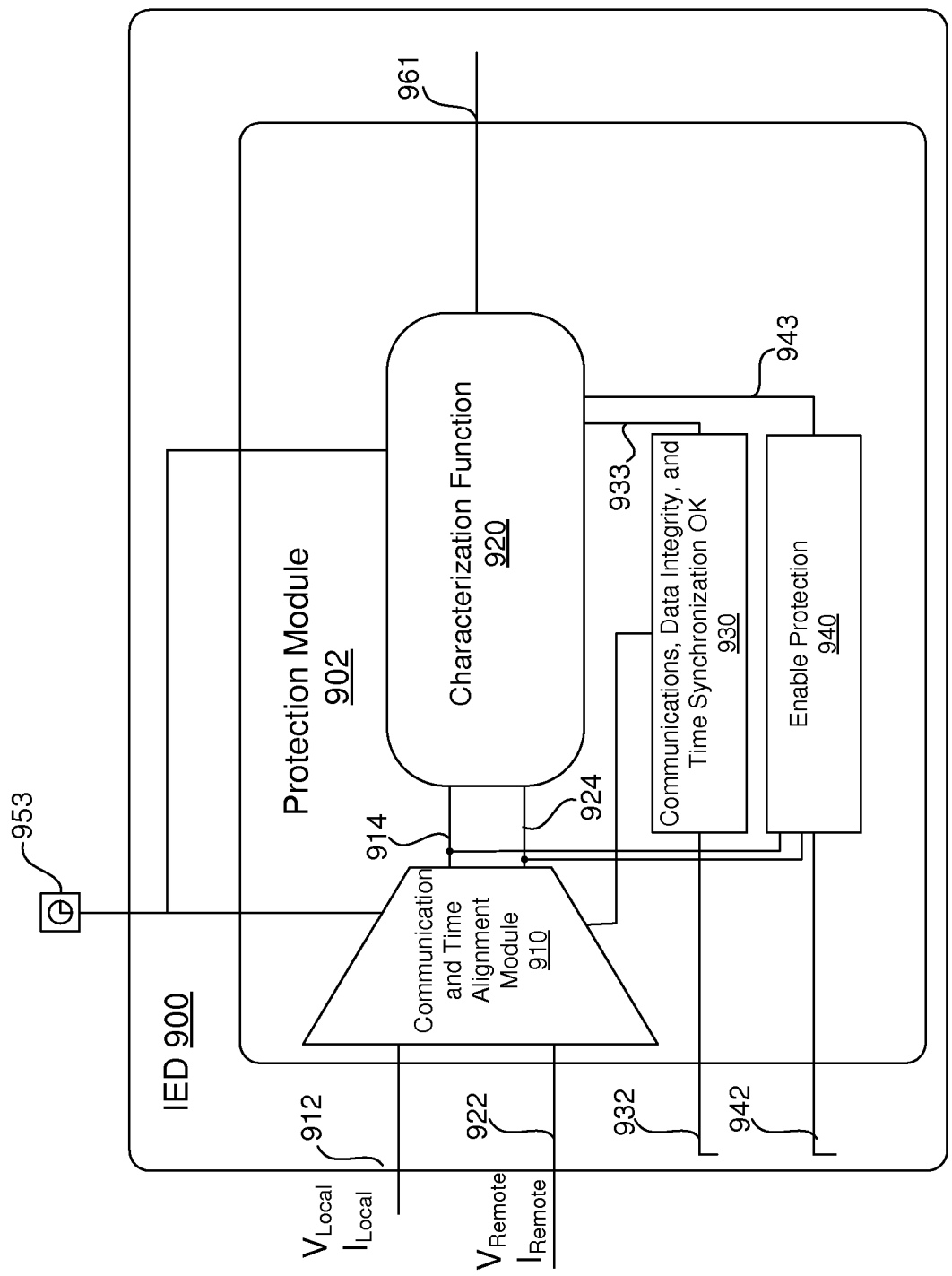
FIG. 9 is a block diagram of one embodiment of an electrical power system protection module that employs time aligned voltage measurements to calculate a phase angle difference between a local and remote voltage signal.

Turning now to FIG. 9, a block diagram of one embodiment of an IED 900 having a protection module 902 comprising a characterization module 920 is depicted. The characterization module 920 may comprise a power swing, predictive OOS detection, and/or out-of-step detection function. Systems implementing such functions are depicted and discussed below.

The protection module 902 may be communicatively coupled to a local voltage sensor (not shown) of IED 900 to obtain local measurements 912 via a transformer (not shown) coupled to a power transmission media (not shown). The protection module 902 may be communicatively coupled through IED 900 to a remote IED (not shown) using a communications module 910. The communications module 910 may provide a remote phasor measurement 922 to the protection module 902. As discussed above, local and remote measurements may comprise a three-phase voltage measurements, one or more phases of a three-phase voltage, and/or one or more symmetric components of a three-phase signal (e.g., a negative, positive, or zero component of a three-phase voltage).

A communication and time alignment (CTA) module 910 may be used to receive local phasor measurements 912 and remote phasor measurements 922. The CTA module 910 may time align phasor measurements 912 obtained at IED 900 with the remote phasor measurements 922.

The CTA module 910 may be in communication with a local IED (not shown) and a remote IED (not shown) to receive phasor measurements therefrom. Alternatively, IED 900 may comprise a local IED, and the phasor measurements 912 may be directly obtained via an instrument transformer communicatively coupled to the power system.

The local measurements 912 and/or the remote measurements 922 may be received using any communication technique, methodology, and/or infrastructure known in the art. In some embodiments, the CTA module 910 may receive the measurements 912 and/or 922 using the IEEE C37.118 communication standard (hereafter "118 standard"). The 118 standard is a standard for synchronized phasor measurement systems in power systems. The 118 standard is not media dependent and, as such, may be used on EIA-232 media, Ethernet communications connections, or the like. Accordingly, the local and remote IEDs (not shown) and/or the CTA module 910 may be referred to as "118 devices." In this embodiment, the CTA module 910 may be configured to communicate with the IEDs (not shown) using the 118 standard. One skilled in the art, however, would recognize that the CTA module 910 could be configured to use any communications standard and/or protocol known in the art. As such, this disclosure should not be read as limited to any particular communications standard and/or protocol.

As discussed above, the CTA module 910 may time align the local measurements 912 and remote measurements 922 by delaying one or more of the measurements relative to one another. Alternatively, the time alignment may comprise modifying a phase and/or magnitude of a local voltage measurement 912 and/or remote voltage measurement 922. As discussed above, the phase and/or magnitude of remote voltage measurement 922 may be been synchronized to a common time reference (e.g., synchronized to time reference 953). As such, synchronization of the measurements 912 and 922 may comprise modifying a phase and/or magnitude of one or more of the local and/or remote measurements 912 and/or 922. Also as discussed above, the local 912 measurements and/or remote measurements 923 may comprise a time stamp and/or some other reference to a measurement interval defined relative to a common time reference (e.g., relative to time reference 953). In this embodiment, the CTA module 910 may use the time stamp, measurement interval, and/or measurement interval offset to time align the measurements 912 and 922. Alternatively, the remote voltage measurements 912 and/or the local voltage measurements 922 may comprise synchrophasor measurements. In this embodiment, the time alignment mechanism may be that disclosed in Zweigle et al.

As discussed above, the time alignment technique and/or methodology used by the CTA module 910 may employ a time reference 953. The time reference 953 may comprise and/or be synchronized to a common time reference (e.g., a GPS time reference of the like). As such, the time reference 953 may be a separate component in communication with IED 900 (as shown in FIG. 9), or may be an internal component of IED 900.

The output of the CTA module 910 may comprise time aligned voltage measurements 914 and 924, which may flow to a characterization function module 920. The characterization function module 920 may derive an angle difference δ, using the time aligned voltage measurements 914 and 924. Using the angle difference δ, the characterization function module 920 may calculate a slip frequency $S_F$, and acceleration $A_F$. The angle difference δ, slip frequency $S_F$, and acceleration $A_F$ may be used to monitor the electrical power system as will be described below. This may comprise determining an operating point of the power system using the angle difference δ, slip frequency $S_F$, and/or acceleration $A_F$. The operating point may be compared to one or more characteristics, such as predictive OOS characteristic or the like. An OOS condition may be detected if the operating point falls outside of the one or more operating characteristics.

The protection module 902 may comprise Communications, Data Integrity, and Time Synchronization OK (CDITS) module 930, which may determine whether the inputs to the characterization function module 920 are valid. The CDITS module 930 may receive an input 932 from IED 900 indicating the status of a communications interface (not shown) coupling IED 900 to a local IED (not shown) and/or remote IED (not shown). In addition, the CDITS module 930 may receive a data integrity check from the communications interface (not shown), which may monitor the communication interface for errors (e.g., using a parity bit, error correction codes, message hashing, or the like). Faults in the communication interface (not shown) may be passed to CDITS module 930, which may disable the characterization function module 920 to prevent false hits due to faulty data.

The CDITS module 930 also may also receive an input from the CTA module 910 and/or time reference 953 to indicate the status of the time alignment system. For instance, an unexpected delay in the communications system may cause the time alignment function to fail (e.g., the delay is greater than the memory capacity of the time alignment system). If any of the communications integrity, data integrity, and/or time synchronization inputs indicate an error, CDITS module 930 may indicate such via output 933, which may disable the characterization function module 920, to prevent the characterization function module 920 from registering a power swing and/or OOS condition based on bad measurement data. If each of the communications integrity, data integrity, and time synchronization inputs indicate nominal operation, the CDITS module 930 may indicate such via output 933 to enable the characterization function module 920.

The protection module 920 may comprise an enable protection module 940. The enable protection module 940 may receive the time aligned voltage measurements from the CTA module 910. The enable protection module 940 may compare the measurements to a threshold to determine whether the characterization function module 920 should be enabled. Assertion of the enable output 943 may enable the operation of the characterization function module 920. If the criteria of the enable protection module 940 are not met, the enable output 943 may disable the characterization function module 920 (e.g., may de-assert the enable output 943). The output 961 of the characterization function (discussed below) may comprise a power swing, an OOS, and/or a predictive OOS detection signal.

A. Power Swing Detection

As discussed above, the characterization function module 920 may detect a power swing by measuring the angle difference δ, slip frequency $S_F$, and acceleration $A_F$ between a sending-end and receiving-end of an electrical power system. The sending-end of a power system may comprise one or more sending-end generators and/or generator equivalents and a receiving-end of a power system may comprise one or more receiving-end generators and/or generator equivalents. A local IED may be communicatively coupled to the sending-end of the system, and a remote IED may be communicatively coupled to the receiving-end of the system (or vice versa). As discussed above, using the voltage measurements obtained by the local and remote IEDs, an angle difference δ between the sending-end and the receiving end of the power system segments can be determined. As such, a power swing may be detected between the local and remote IED using the measured angle difference δ and the slip frequency $S_F$ and acceleration $A_F$ values derived therefrom. The characterization function module 920 may calculate the angle difference δ and other measurements to detect a power swing.

Figure 10:
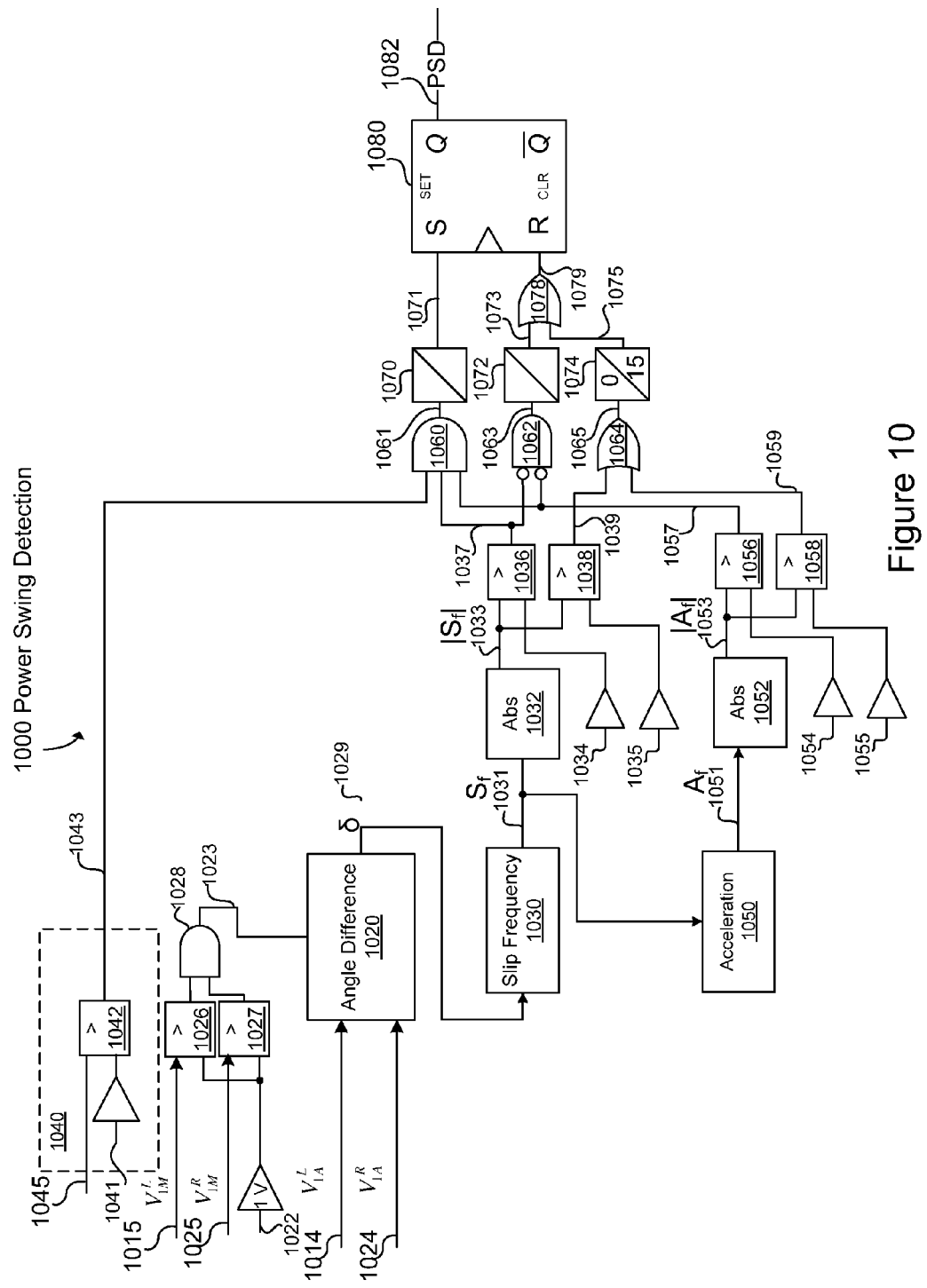
FIG. 10 is a block diagram of one embodiment of a power swing detection system.

Turning now to FIG. 10, one embodiment of a power swing detection system 1000 according to the teachings of this disclosure is depicted. The power swing detection system 1000 may form part of a protection module and/or characterization function module of an IED (e.g., elements 902 and/or 920 of FIG. 9).

The power swing detection system 1000 receives time aligned voltage inputs 1014 and 1024. The inputs 1014 and 1024 correspond to time aligned positive sequence phase voltage measurements obtained at a local IED and a remote IED, respectively. As discussed above, the local and remote phase voltage measurements 1014 and 1024 may have been time aligned using a time stamp, synchrophasor, buffering, or the like.

An angle difference module 1020 computes an angle difference δ between the time aligned local positive sequence voltage signal 1014 and the remote positive sequence voltage signal 1024. The angle difference module 1020 may be enabled by an input signal 1023. The input signal 1023 is driven by an AND gate 1028 having comparator inputs 1026 and 1027. The comparator 1026 may assert its output if the magnitude of the positive-sequence voltage magnitude signal 1015 is greater than the value set by constant 1022 (e.g., 1 V secondary). Comparator 1027 may assert its output if the magnitude of the remote positive-sequence voltage magnitude signal 1025 is greater than the value set by constant 1022. In this way, the enable signal 1023 may enable operation of the angle difference module 1020 only if the voltage measurements 1015 and 1025 exceed the threshold defined by constant 1022.

When enabled by the enable input 1023, the angle difference module 1020 calculates an angle difference δ between the time aligned positive sequence voltage measurements 1014 and 1024. This may be done in a variety of different ways, including calculating a difference and/or absolute value of the difference between the phase angle measurements of 1014 and 1024, or the like.

The angle difference δ is output via output 1029 of the angle difference calculator 1020. This angle difference δ may flow to a slip frequency calculator module 1030, which may determine a slip frequency $S_F$ between the local and remote IEDs based on the angle difference δ input 1029. As discussed above, this may comprise calculating a derivative and/or discrete derivative of the angle difference δ input 1029 (depending on whether the measurements 1014 and 1024 are continuous or discrete).

The output 1031 of the slip frequency calculator module 1030 comprises a slip frequency $S_F$. The slip frequency $S_F$ flows to an absolute value module 1032 and an acceleration calculator module 1050.

The output 1033 of the slip frequency absolute value calculator module 1032 provides an absolute value of the slip frequency $S_F$ 1031 input.

An acceleration calculator module 1050 calculates acceleration $A_F$ between the local and remote power system areas using the slip frequency $S_F$ 1031 input. As discussed above, this may comprise calculating a derivative and/or discrete derivative of the input 1031 (depending on whether continuous or discrete measurement samples are received).

The output 1033 of the slip frequency absolute value calculator 1032 flows to slip frequency comparators 1036 and 1038. The slip frequency comparator 1036 compares the absolute value of the slip frequency $S_F$ input 1033 to a constant 1034. In one embodiment, the constant 1034 may be 0.2 Hz. Accordingly, the output 1037 of the slip frequency $S_F$ comparator 1036 asserts if the absolute value of slip frequency, 1033, is greater than 0.2 Hz (e.g., the output 1037 is asserted if $|S_F|>0.2$ Hz and de-asserted otherwise).

The slip frequency comparator 1038 compares the absolute value of the slip frequency $S_F$ input 1033 to a constant 1035. In one embodiment, the constant 1035 is 10 Hz. As such, the output 1039 of slip frequency $S_F$ comparator 1038 asserts if the absolute value of slip frequency $S_F$ 1033 is greater than 10 Hz (e.g., output 1039 is asserted if $|S_F|>10$ Hz and is de-asserted otherwise).

The acceleration $A_F$ comparator 1056 compares the absolute value of the acceleration $A_F$ input 1053 to a constant 1054. In one embodiment, the constant 1054 may be 0.1 Hz/sec. As such, the output 1057 of acceleration frequency $A_F$ comparator 1056 asserts if the absolute value of the acceleration $A_F$ input 1053 is greater than 0.1 Hz/sec (e.g., output 1057 asserts if $|A_F|>0.1$ Hz/sec and is de-asserted otherwise).

The acceleration $A_F$ comparator 1058 compares the absolute value of the acceleration $A_F$ input 1053 to a constant 1055. In one embodiment, the constant 1055 may be 50 Hz/sec. As such, the output 1059 of the acceleration $A_F$ comparator 1058 asserts if the absolute value of the acceleration $A_F$ input 1053 is greater than 50 Hz/sec. (e.g., output 1059 asserts if $|A_F|>50$ Hz/sec and is de-asserted otherwise).

The outputs of slip frequency $S_F$ comparator module 1036 and the acceleration $A_F$ comparator module 1056 flow to AND gate 1060. The AND gate 1060 receives an additional input 1043 from an enable module 1040. In some embodiments, the enable protection module 1040 may correspond to the enable protection module 940 described above in conjunction with FIG. 9. If the criteria of the enable protection module 1040 are not met, the enable output signal 1043 may disable the AND gate 1060 (e.g., de-assert the input 1043).

The output of the AND gate 1060 flow to a security counter 1070. The security counter 1070 may assert its output 1071 if its input 1061 is asserted for a pre-determined time period and/or number of clock cycles. For example, the security counter 1070 may assert its output 1071 if the input 1061 has been asserted for three (3) measurement samples and/or clock cycles. This may prevent false power swing detections occurring due to glitching and/or temporary abnormalities on the power system segment.

The outputs of slip frequency $S_F$ comparator module 1036 and acceleration $A_F$ comparator module 1056 flow to an inverted input AND gate 1062. The output 1063 of the inverted input AND gate 1062 assert if both of its inputs (inputs 1037 and 1057) are de-asserted; otherwise, the output 1063 is de-asserted.

The output 1063 of the inverted input AND gate 1062 flows to a security counter 1072. As discussed above, the security counter 1072 may assert its output 1073 only if its input 1063 is asserted for a pre-determined period of time and/or number of clock cycles (e.g., three (3) samples and/or cycles). Also as discussed above, the security counter 1072 may prevent false outputs generated due to glitching and/or temporary abnormalities in the power system segment.

The outputs 1039 and 1059 of the slip frequency $S_F$ comparator 1038 and the acceleration $A_F$ comparator 1058 flow to an OR gate 1064. The output 1065 of the OR gate 1064 is asserted if either of its inputs 1039 or 1059 are asserted. The output 1065 of the OR gate 1064 flows to security counter 1074. The security counter 1074 may assert its output 1075 if its input 1065 is asserted for a pre-determined time period and/or number of clock cycles (e.g., three (3) samples and/or cycles).

In some embodiments, after the security counter 1074 asserts the output 1075 (e.g., after the input 1065 has been asserted for a pre-determined time period and/or number of clock cycles), the security counter may be configured to maintain the output 1075 in an asserted state for a pre-determined time period and/or number of clock cycles after the input 1065 is de-asserted. For example, the security counter 1074 may be configured to assert the output 1075 for fifteen (15) clock cycles after the input 1065 is de-asserted.

The outputs 1073, 1075 of the security counters 1072, 1074 flow to an OR gate 1078. The OR gate 1078 asserts its output 1079 if either of its inputs 1073 or 1075 are asserted.

The output 1071 of the counter 1070 flows to the set 'S' input of an SR flip flop 1080. The output 1079 of the OR gate 1078 flows to the reset 'R' input of the SR flip flop 1080. If the S input 1071 is asserted, the output 1082 of the SR flip flop 1080 will assert upon receipt of a latching sample and/or clock signal (not shown). If the R input 1079 of the SR flip flop 1080 is asserted, the output 1082 of the SR flip flop 1080 will de-assert on the next clock signal (not shown). If neither input 1071 or 1079 is asserted, the output 1082 of the SR flip flop 1080 retains its last value (e.g., either set or reset).

The output 1082 of the SR flip flop 1080 represents a power swing detection bit (PSD). As such, assertion of the output 1082 indicates that a power swing condition exists in the power system segment defined by the local and remote IEDs.

In the FIG. 10 embodiment described above, the power swing detection system 1000 may detect a power swing condition in a power system segment if the absolute value of the slip frequency ($|S_F|$) is greater than 0.2 Hz, the absolute value of the acceleration ($|A_F|$) is greater than 0.1 Hz/sec., and the local current satisfies a sensitivity threshold (e.g., $I_{IM}^L > 0.1 \cdot |I_{NOM}|$) for a sufficient time period and/or number of clock cycles (depending on the configuration of security counters 1070, 1072, and 1074). As described above, these conditions may cause the PSD output 1082 to assert. The PSD output 1082 may de-assert if either: $|S_F|$ is greater than 10 Hz or less than 0.2 Hz; $|A_F|$ is greater than 50 Hz/sec or less than 0.1 Hz/sec.; or the sensitivity threshold (e.g., nominal current threshold $I_{IM}^L < 0.1 \cdot |I_{NOM}|$) is not satisfied.

The values used for constants 1034, 1035, 1041, 1054, and 1055 may be modified according to the specific requirements and/or parameters of a particular power system segment. Accordingly, this disclosure should not be read as limited to any particular set of constant values.

B. Predictive Out-of-Step Tripping (OOST)

A predictive out-of-step (OOS) detection and/or tripping system may use the angle difference δ between a remote and local IED along with the slip frequency, $S_F$, and acceleration, $A_F$, derived therefrom, to define a stable and unstable region of the power system. As discussed above, in a stable condition, the power system will return to nominal operating parameters after a disturbance. However, in an unstable condition, the power system may not return to nominal operating parameters. An unstable OOS condition may cause large swings in power within the power system that may damage equipment, cause outages, or the like.

In one embodiment of a predictive out-of-step tripping (OOST) system, an unstable region of a power system may be defined as shown in Equations 2.9a and 2.9b:

$$A_F > K \cdot S_F + A_{Offset\_1} \quad \text{Eq. 2.9a}$$

$$A_F < K \cdot S_F - A_{Offset\_2} \quad \text{Eq. 2.9b}$$

In Equations 2.9a and 2.9b, $A_F$ may represent an acceleration of the angle difference δ between local and remote IEDs, K may be a slope constant of the power system, $S_F$ may represent the slip frequency of angle difference δ, and constants $A_{offset\_1}$ and $A_{offset\_2}$ may be constant positive and negative δ acceleration offset values, respectively.

The values of K, $A_{Offset\_1}$, and $A_{Offset\_2}$ may be determined from the characteristics of the power system and/or power system testing and modeling. For example, a power system engineer may model the system to determine the response of the power system to various disturbances (e.g., different fault types) and/or power swing conditions. This modeling may determine a stability and instability region for the power system. The Equations 2.9a and 2.9b may comprise a predictive OOS characteristic of a power system. Accordingly, if a operating point (determined using the slip frequency $S_F$ and acceleration $A_F$) falls outside of the predictive OSS characteristic, an OOS condition may be detected.

Figure 11:
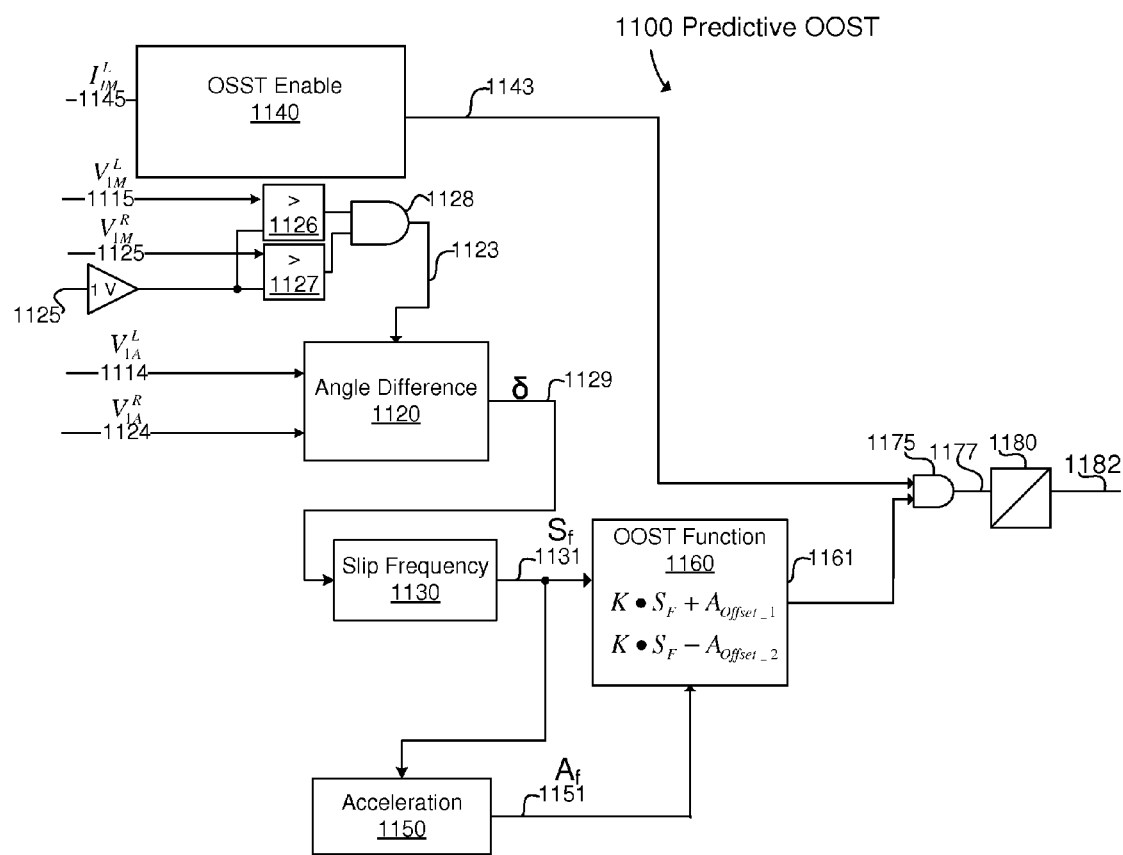
FIG. 11 is a block diagram of one embodiment of a predictive out-of-step detection system.

FIG. 11 depicts a block diagram of one embodiment of a predictive OOST system. The predictive OOST system 1100 comprises an OOST enable module 1140. In one embodiment, the OOST enable module 1140 functions similarly to the enable protection module 940 of FIG. 9. Accordingly, the OOST enable module 1140 may assert its enable output 1143 if a positive-sequence current value 1145 is greater than a constant value (e.g., a current sensitivity threshold). The constant value used by the OOST enable module 1140 may be $0.1 \cdot |I_{NOM}|$, where $I_{NOM}$ is a nominal pickup current value for the system. As such, if input current 1145 is less than this constant value, the enable output 1143 may de-assert which may, in turn, nullify the other input 1161 of AND gate 1175.

The Predictive OOST module 1100 may comprise an angle difference δ calculator 1120 to calculate an angle difference between a local positive sequence voltage measurement 1114 and a remote positive sequence voltage measurement 1124. As discussed above, the phase voltage measurements used to determine the positive sequence values 1114 and 1124 may be time aligned. The angle difference calculator 1120 may determine the angle difference δ between the inputs 1114 and 1124. As discussed above, the angle difference δ may be calculated in a number of different ways, including subtracting a differential between the phase angles of the local 1114 and remote 1124 measurements. The angle difference calculator 1120 may receive an enable signal 1123 generated as discussed above in conjunction with FIGS. 9 and 10 (e.g., enable protection module 940 of FIG. 9).

The output 1129 of the angle difference δ calculator 1120 may flow to a slip frequency $S_F$ calculator 1130. As discussed above, the slip frequency calculator 1130 may calculate a slip frequency $S_F$ using the angle difference δ 1129. The slip frequency $S_F$ output 1131 flows to other modules of the predictive OOST system 1100 as described below.

The acceleration $A_F$ calculator 1150 calculates acceleration $A_F$ using the slip frequency $S_F$ input 1131 substantially as described above. The acceleration $A_F$ output 1151 flows to the OOST function module 1160.

The OOST function module 1160 may predicatively detect an OOS condition in the electrical power system according to Equations 2.9a and 2.9b discussed above ($K^*S_F + A_{Offset}$).

As discussed above, Equations 2.9a and 2.9b implemented by the OOST function module 1160 may comprise a predictive OOS characteristic. Accordingly, the OOST function module 1160 may predicatively detect an OOS condition by comparing an operating point (determined using the slip frequency $S_F$ and acceleration $A_F$) to the predictive OOS operating characteristic. If the operating point falls outside of the OOS characteristic, the OOST function module 1160 may assert its output 1161. Assertion of the output 1161 may indicate that the power system segment is predicatively in an OOS condition (e.g., is unstable).

The output 1161 flows to AND gate 1175. The input 1143 of the AND gate 1175 comprises the output of the OOST enable module 1140. Additionally, the AND gate 1175 may receive an input from a communication, data integrity check module (not shown). This may prevent an OOST conditions from being falsely detected.

The output of AND gate 1175 flows to a security counter 1180. The security counter 1180 may assert its output 1182 if its input 1177 is asserted for a pre-determined time period and/or number of clock cycles (e.g., for three (3) samples and/or clock cycles). As discussed above, the security counter 1180 may prevent registering a false predictive OOS condition produced due to glitching and/or temporary power system conditions.

The output 1182 of counter 1180 comprises a predictive OOST output signal. Accordingly, the output 1182 indicates that the electrical power system is operating in undesirable conditions, and measures should be taken. Such measures may include, but are not limited to: blocking distance elements; shedding load; shedding generation; separating power system areas; and the like.

C. Out-of-Step Detection (OOSD)

An out-of-step detection (OOSD) function may detect a sending-end and/or receiving end generator or generator equivalent pole slip event in a power system segment. The OOSD function may operate by comparing an absolute value of the angle difference δ between local and remote IEDs to a threshold, referred to as an out-of-step threshold or OOSTH. The value of the OOSTH used in a particular electrical power system segment may define an angle difference operating region (ADOPR) of the electrical power system segment.

Figure 12:
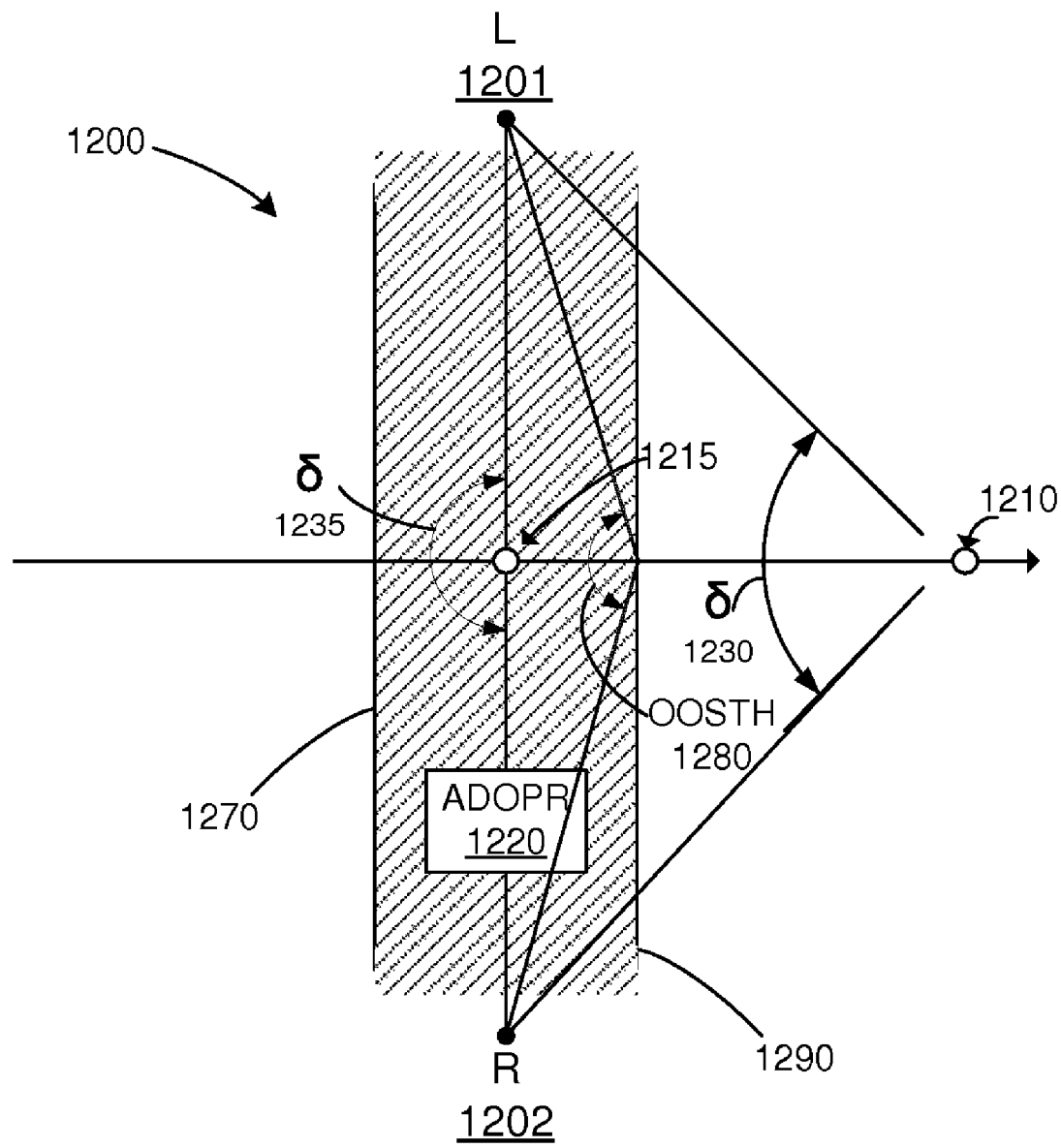
FIG. 12 depicts an angle difference operating region used to detect an out-of-step condition between a local and remote generator and/or generator equivalent.

FIG. 12 depicts one embodiment 1200 of an operating region and swing detection region in an electrical power system segment having a local 1201 and remote 1202 generator and/or generator equivalent. The angle difference δ between the local 1201 and remote 1202 generators and/or generator equivalents may be 60° at the start of the power swing. This condition is represented in FIG. 12 by operating point 1210, which shows a phase angle difference δ of 60° 1230. An OOS condition may be detected when the phase angle difference δ varies from 60° to 180° passing through the OOSTH value 1280. The OOSTH value is depicted in FIG. 12 as 1280. As can be seen in FIG. 12, OOSTH creates an ADOPR region 1220. As such, an OOS condition may be detected when the operating point reaches the 180° point 1235.

Figure 13:
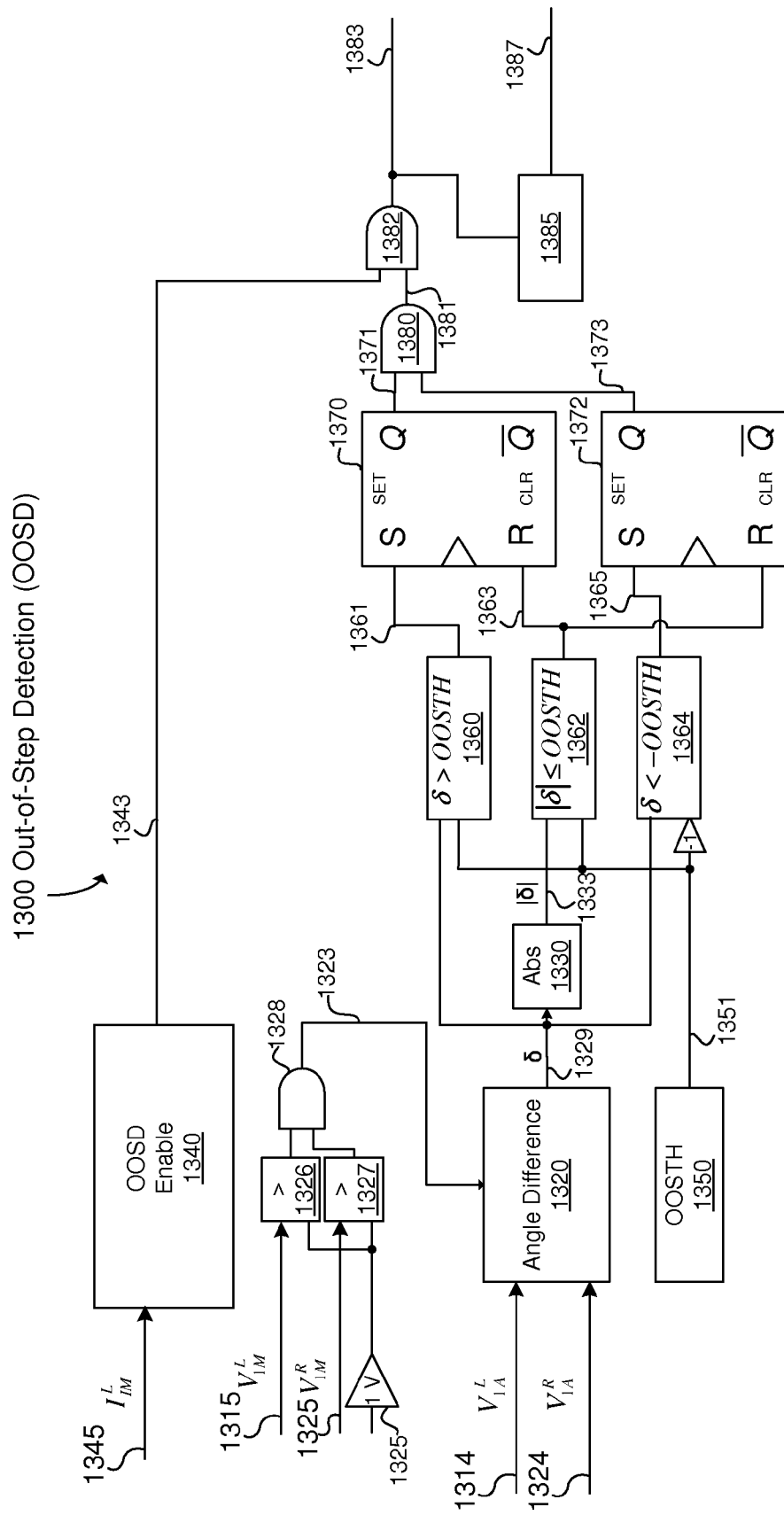
FIG. 13 is a block diagram of one embodiment of an out-of-step detection system.

Turning now to FIG. 13, a block diagram 1300 of a system for detecting an OOS condition per diagram 1200 of FIG. 12 is depicted. The OOS detection system 1300 comprises an OOSD enable module 1340, which may function similarly to the enable module described in FIGS. 9, 10 and 11. Accordingly, the OOSD enable module 1340 may assert its output 1343 if a positive-sequence current value 1345 is greater than a sensitivity threshold constant value. The sensitivity threshold constant value used by OOSD enable module 1340 may be $0.1 \cdot |I_{NOM}|$, where $I_{NOM}$ is a nominal pickup current value for the system. As such, if the input current 1345 is less than the sensitivity threshold value, the output 1343 of the OOSD enable module 1340 may be de-asserted which may, in turn, nullify the other inputs 1371 and 1373 of AND gate 1380, preventing detection of an OOS condition.

Out-of-Step detection (OOSD) module 1300 comprises an angle difference δ calculator 1320. As discussed above, the angle difference δ calculator 1320 may receive a local, time aligned positive sequence voltage measurement 1314 and a remote, time aligned, positive sequence voltage measurement 1324. The angle difference calculator 1320 may calculate a phase angle difference between inputs 1314 and 1324. The angle difference calculator 1320 may receive an enable signal 1323 generated as discussed above in conjunction with FIG. 10.

An angle difference δ output 1329 flows to an absolute value calculator 1330, a comparator 1360, and a comparator 1364. The absolute value calculator 1330 produces an output 1333 comprising the absolute value of the angle difference δ input 1329.

The comparator 1360 compares the angle difference δ input 1329 to an out-of-step threshold (OOSTH) constant 1350. The comparator 1360 asserts its output 1361 if the angle difference δ input 1329 is greater than the OOSTH 1351. Otherwise, the output 1361 may be de-asserted.

The comparator 1362 may compare the absolute value of the angle difference |δ| input 1333 to the OOSTH 1350 and may assert its output 1363 if input 1333 (|δ|) is less than or equal to OOSTH 1351.

The comparator 1364 may compare the angle difference δ input 1329 to the negative of the OOSTH 1350 and may assert its output 1365 if the angle difference input 1329 δ, is less than the negative OOSTH 1350.

The output 1361 of the comparator 1360 may flow to the S input of an SR flip flop 1370. The R input of SR flip flop 1370 may receive its input from comparator 1362. As such, if S input 1361 of SR flip flop 1370 is asserted and the R input 1363 is de-asserted, the SR flip flop may latch an asserted output on 1371. The output 1371 of SR flip flop may de-assert if S input 1361 is de-asserted and R input 1363 is asserted.

The output 1365 of the comparator 1364 flows to the S input of the SR flip flop 1372. The R input of the SR flip flop 1372 may receive its input from comparator 1362. Accordingly, if the S input 1365 of SR flip flop 1372 is asserted and the R input 1363 is de-asserted, the output 1373 of SR flip flop 1372 may assert. Similarly, if the S input 1365 is de-asserted and the R input 1363 is asserted, and output 1373 of SR flip flop 1372 may be de-asserted.

The output 1371 of the SR flip flop 1370, and the output 1373 of the SR flip flop 1372 flow to an AND gate 1380. The output 1381 of the AND gate 1380 flows to AND gate 1382. The AND gate 1382 receives the OOSD enable signal 1343. The OOSD enable signal 1343 may be based on the magnitude of local phase current as discussed above. Accordingly, an OOSD condition will be detected through AND gate 1382 only if OOSD enable signal 1343 is asserted.

The output 1383 of the AND gate 1382 may comprise an out-of-step detection (OOSD) signal. Accordingly, the OOSD 1383 detection may be asserted upon detection of a first angle difference δ that is greater than OOSTH 1350 followed by detection of an angle difference δ that is less than the than the negative of OOSTH 1350 or vice versa.

The output 1383 of the AND gate 1382 may flow to counter 1385, which may keep a running total of the number of OOSD detections made by the OOSD 1300. The running total calculated by the counter 1385 may be provided on counter output 1387.

Referring to FIG. 12, as the angle difference δ between flows from right to left, the circuit 1300 may detect an OOS condition. For example, at point 1210 shown in FIG. 12, the angle difference δ may be less than the OOSTH, which for the purposes of this example, may be 120°. Referring to FIG. 13, while the angle difference δ is less than the OOSTH, the comparator 1362 asserts output 1363, which resets the SR flip flops 1370 and 1372. Referring back to FIG. 12, the angle difference δ may continue to increase from right to left until it enters the ADOPR region 1220. Referring again to FIG. 13, when the angle difference δ exceeds the OOSTH, (e.g., shown as the rightmost boundary 1290 of the ADOPR region 1220), the output 1361 of the comparator 1360 may assert, which will cause the output 1371 of the SR flip flop 1370 to assert. Also, the output 1363 of the comparator 1362 may de-assert, since the absolute value of the angle difference δ is no longer less than or equal to the OOSTH.

The angle difference δ may continue to increase to 180° (shown as point 1215 in FIG. 12). As the angle difference δ increases beyond 180° (into the left portion of the ADOPR region 1220), the angle difference δ may be expressed as a negative value (e.g., the angle difference δ may range from −180° to 180°). Accordingly, since this example uses an OOSTH of 120°, the left boundary of the ADOPR region 1220, may be expressed as −120°.

Referring again to FIG. 13, as the angle difference δ crosses the 180° point, the comparator 1364 may assert its output 1365 since the angle difference δ is less than the negative OOSTH. For example, in FIG. 12, 10° to the left of the 180° axis 1235 corresponds to a −170° angle difference δ, which is less than the negative OOSTH (−120°). In FIG. 13, assertion of the comparator output 1365, may cause the output 1373 of the SR flip flop 1372 to assert. In addition, the output 1381 of the AND gate 1380 may assert, which may comprise an OOSD detection 1383.

As the angle difference δ continues to diverge, the angle difference δ reaches the left boundary 1270 of the ADOPR region 1220 (e.g., −120°). In FIG. 13, the angle difference δ of −120° may cause the output 1363 of the comparator 1362 to assert (since the angle difference δ is equal to the OOSTH), which may clear the SR flip flops 1370 and 1372.

The system operates similarly for an angle difference δ progressing from left to right on FIG. 12. For example, the angle difference δ may fall within the portion of FIG. 12 (e.g., at −80°, which is to the left of the ADOPR 1220). Referring to FIG. 13, this may cause the output 1363 of the comparator 1362 to be asserted, since the absolute value of the angle difference δ (80°) is less than the OSSTH (e.g., 120°). This may cause the SR flip flops 1370 and 1372 to be reset.

In FIG. 12, as the angle difference δ moves from left to right, it may enter the ADOPR region 120. In FIG. 13, this may cause the output 1363 of the comparator 1362 to de-assert since the absolute value of the angle difference δ (e.g., 130°) is no longer less than or equal to the OOSTH (e.g., 120°). In addition, the output 1373 of the SR flip flop 1372 may assert since the angle difference δ (e.g., −130°) is less than the negative OSSTH (e.g., −120°).

As the angle difference δ moves past the center point in FIG. 12, the output 1371 of the SR flip flop 1372 may assert since the angle difference δ goes to 180° at the center point, which is greater than the OOSTH (e.g., 120°). The output 1363 of the comparator 1362 remains de-asserted since the absolute value of the angle difference δ is not less than or equal to the OSSTH. In addition, the output 1381 of the AND gate 1380 may assert, which may comprise an OOSD detection 1383.

As the angle difference δ continues to diverge, the angle difference reaches the right boundary 1290 of the ADOPR region 1220 (e.g., 120°). In FIG. 13, the angle difference δ of 120° may cause the output 1363 of the comparator 1362 to assert (since the angle difference δ is equal to the OOSTH), which may clear the SR flip flops 1370 and 1372.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable medium having stored instructions thereon that may be used to program a computer (or other electronic device) to perform processes described herein. The computer-readable medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

As used herein, a software module or component may include any type of computer instruction or computer executable code located within a memory and/or other data storage device. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the invention.

I claim:

1. A method for monitoring an electrical power system, comprising:
    using an intelligent electronic device to perform steps, comprising:
    receiving a first voltage measurement obtained at a first location in the electrical power system;
    receiving a second voltage measurement obtained at a second location in the electrical power system;
    time aligning the first voltage measurement and the second voltage measurement;
    calculating an angle difference between the first time aligned voltage measurement and the second time aligned voltage measurement; and
    using the angle difference to monitor the electrical power system, comprising:
        using the angle difference to calculate a slip frequency and an acceleration:
        determining an operating point comprising the slip frequency and the acceleration;
        detecting an out-of-step (OOS) condition by comparing the operating point against an OOS characteristic.

2. The method of claim 1, wherein the first voltage measurement and the second voltage measurement each comprise a respective time stamp.

3. The method of claim 2, wherein the first voltage measurement and the second voltage measurement are time aligned using their respective time stamps.

4. The method of claim 3, wherein the first voltage measurement is obtained by a first intelligent electronic device (IED) communicatively coupled to the first location in the electrical power system, wherein the second voltage measurement is obtained by a second IED communicatively coupled to the second location in the electrical power system, and wherein the first IED and the second IED are communicatively coupled to a common time reference.

5. The method of claim 1, wherein the first voltage measurement and the second voltage measurement each comprise a synchrophasor.

6. The method of claim 5, wherein the first IED comprises an IEEE C37.118(2005) device and the second IED comprises an IEEE C37.118 (2005) device, and wherein the first voltage measurement and the second voltage measurement are received by an IEEE C37.118 (2005) device.

7. The method of claim 1, further comprising:
    receiving a first measurement obtained at the first location in the electrical power system; comparing the first measurement to a current sensitivity threshold; and
    enabling monitoring of the electrical power system using the angle difference if the first measurement satisfies the current sensitivity threshold.

8. The method of claim 1, wherein the first voltage measurement comprises a measurement of a three-phase voltage signal, and wherein the second voltage measurement comprises a measurement of a second three-phase voltage signal, the method further comprising:
    calculating a first alpha-Clarke component using the first voltage measurement; and
    calculating a second alpha-Clarke component using the second voltage measurement.

9. The method of claim 8, wherein the angle difference is calculated using the first alpha-Clarke component and the second alpha-Clarke component.

10. The method of claim 1, wherein the first voltage measurement comprises a measurement of a first three-phase voltage signal, and wherein the second voltage measurement comprises a measurement of a second three-phase voltage signal, the method further comprising:
 calculating a first positive sequence voltage using the first voltage measurement; and
 calculating a second positive sequence voltage using the second voltage measurement.

11. The method of claim 10, wherein the angle difference is calculated using the first positive sequence voltage and the second positive sequence voltage.

12. The method of claim 1, wherein using the angle difference to monitor the electrical power system comprises detecting an out-of-step (OOS) condition between the first location in the electrical power system and the second location in the electrical power system using the angle difference.

13. The method of claim 12, wherein detecting an OOS condition in the electrical power system comprises:
 detecting a first angle difference that is greater than an out-of-step threshold (OOSTH): and
 detecting a second angle difference that is less than a negative OOSTH.

14. The method of claim 13, wherein detecting an OOS condition in the electrical power system comprises:
 detecting a first angle difference that is less than a negative out-of-step-threshold (OSSTH); and
 detecting a second angle difference that is greater than a OSSTH.

15. The method of claim 13, further comprising clearing an OOS condition detected in the electrical power system upon detecting an angle difference having an absolute value less than or equal to the OSSTH.

16. The method of claim 13, wherein the OOSTH and the negative OOSTH are determined using one of the characteristics of the electrical power system, modeling of the electrical power system, and testing of the electrical power system.

17. The method of claim 1, wherein the slip frequency comprises one of a derivative with respect to time and a discrete derivative with respect to time of the angle difference.

18. The method of claim 1, further comprising calculating the acceleration using the slip frequency.

19. The method of claim 1, wherein the acceleration comprises one of a derivative with respect to time and a discrete derivative with respect to time of the slip frequency.

20. The method of claim 1, wherein using the angle difference to monitor the electrical power system comprises detecting a power swing in the electrical power system using the angle difference, the slip frequency, and the acceleration.

21. The method of claim 20, wherein detecting a power swing in the electrical power system comprises:
 comparing an absolute value of the slip frequency to a first slip frequency threshold;
 comparing an absolute value of the acceleration to a first acceleration threshold;and
 detecting a power swing if the absolute value of the slip frequency is greater than the first slip frequency threshold, and the absolute value of the acceleration is greater the first acceleration threshold.

22. The method of claim 21, wherein detecting a power swing in the electrical power system further comprises:
 comparing the absolute value of the slip frequency to a second slip frequency threshold;
 comparing the absolute value of the acceleration to a second acceleration threshold; and
 detecting a power swing if the absolute value of the slip frequency is greater than the first slip frequency threshold and less than the second slip frequency threshold, and the absolute value of the acceleration is greater than the first acceleration threshold and less than the second acceleration threshold.

23. The method of claim 22 wherein the first slip frequency threshold is approximately 0.2 Hz, the second slip frequency threshold is approximately 10 Hz, the first acceleration threshold is approximately 0.1 Hz/second, and the second acceleration threshold is approximately 50 Hz/second.

24. The method of claim 22, wherein the first slip frequency threshold, the second slip frequency threshold, the first acceleration threshold, and the second acceleration threshold are determined using one selected from the group consisting of the characteristics of the electrical power system, modeling of the electrical power system, and testing of the electrical power system.

25. The method of claim 22, wherein detecting a power swing further comprises maintaining the slip frequency greater than the first slip frequency threshold and less than the second slip frequency threshold, and maintaining the acceleration greater than first acceleration threshold and less than the second acceleration threshold for one of a predetermined time period, predetermined number of voltage measurements, and predetermined number of clock cycles.

26. The method of claim 1, wherein using the angle difference to monitor the electrical power system comprises predicatively detecting an out-of-step (OOS) condition in the electrical power system using the angle difference, the slip frequency, and the acceleration.

27. The method of claim 26, wherein predicatively detecting an OOS condition in the electrical power system using the angle difference, the slip frequency, and the acceleration comprises;
 comparing an operating point determined by the slip frequency and acceleration against the OOS characteristic, wherein the OOS characteristic comprises a predictive OOS characteristic, and
 predicatively detecting an OOS condition if the operating point is outside of the predictive OOS characteristic.

28. The method of claim 27, wherein the predictive OOS characteristic comprises the sum of an acceleration offset value and a product of the slip frequency and an OOS slope constant.

29. The method of claim 28, wherein the acceleration offset value and the OOS slope constant are determined using one selected from the group consisting of characteristics of the electrical power system, modeling of the electrical power system, and testing of the electrical power system.

30. The method of claim 27, wherein predicatively detecting an OOS condition in the electrical power system further comprises maintaining the operating point outside of the predictive OOS characteristic for one of a predetermined time period, predetermined number of voltage measurements, and predetermined number of clock cycles.

31. The method of claim 1, wherein the first location in the electrical power system is approximate to a sending-end generator equivalent of the electrical power system.

32. The method of claim 31, wherein the second location in the electrical power system is approximate to a receiving-end generator equivalent of the electrical power system.

33. A system for monitoring an electrical power system comprising a first intelligent electronic device (IED) communicatively coupled to a first location in the electrical power system to obtain voltage measurements therefrom, and a second IED communicatively coupled to a second location in the electrical power system to. obtain voltage measurements therefrom, the system comprising:

a communication module communicatively coupled to the first IED and the second IED to receive voltage measurements therefrom, wherein the communication module is configured to time align the voltage measurements received from the first IED with the voltage measurements received from the second IED; and a characterization module communicatively coupled to the communication module to calculate an angle difference between the time aligned voltage measurements received from the first IED and the second IED and to monitor the electrical power system using the angle difference by:

using the angle difference to calculate a slip frequency and an acceleration:

determining an operating point comprising the slip frequency and the acceleration:

detecting an out-of-step (OOS) condition by comparing the operating point against an OOS characteristic.

34. The system of claim 33, wherein the voltage measurements received from the first IED and the voltage measurements received from the second IED each comprise a respective time stamp.

35. The system of claim 34, wherein the voltage measurements received from the first IED and the voltage measurements received from the second IED are time aligned using their respective time stamps.

36. The system of claim 35, wherein the first IED and the second IED are communicatively coupled to a common time reference.

37. The system of claim 33, wherein the voltage measurements received from the first IED and the voltage measurements received from the second IED comprise synchronized phasors.

38. The system of claim 37, wherein the first IED comprises a IEEE C37.118(2005) device and the second IED comprises a IEEE C37.118 (2005) device, and wherein the communication module comprises an IEEE C37.118 (2005) device.

39. The system of claim 33, wherein the voltage measurements received from the first IED and the second IED comprise measurements of a three-phase voltage signal, and wherein the characterization module is to calculate a first set of positive sequence voltages using the voltage measurements received from the first IED, and to calculate a second set of positive sequence voltages using the voltage measurements received from the second IED.

40. The system of claim 39, wherein the characterization module is to calculate the angle difference using the first set of positive sequence voltages and the second set of positive sequence voltages.

41. The system of claim 33, wherein the voltage measurements received from the first IED comprise one selected from the group consisting of first positive sequence voltages and first alpha-Clarke components, and wherein the voltage measurements received from the second IED comprise one selected from the group consisting or second positive sequence voltages and second alpha-Clarke components.

42. The system of claim 33, wherein the characterization module is to detect an out-of-step (OOS) condition between the first location in the electrical power system and the second location in the electrical power system using the angle difference.

43. The system of claim 42, wherein the characterization module is to detect an OOS condition in the electrical power system upon detecting a first angle difference that is greater than an out-of-step threshold (OOSTH) and a second angle difference that is less than a negative OOSTH.

44. The system of claim 43, wherein the characterization module is to detect an OOS condition in the electrical power system upon detecting a first angle difference that is less than a negative out-of-step threshold (OOSTH) and a second angle difference that is greater than a OOSTH.

45. The system of claim 43, wherein the characterization module is to clear an OOS condition detected in the electrical power system upon detecting an angle difference having an absolute value less than or equal to the OSSTH.

46. The system of claim 43, wherein the OOSTH and the negative OOSTH are determined by one of the characteristics of the electrical power system, modeling of the electrical power system, and testing of the electrical power system.

47. The system of claim 33, wherein the slip frequency comprises one of a derivative with respect to time and a discrete derivative with respect to time of the angle difference.

48. The system of claim 33, wherein the characterization function is to calculate a acceleration using the slip frequency.

49. The system of claim 48, wherein the acceleration comprises one of a derivative with respect to time and a discrete derivative with respect to time of the slip frequency.

50. The system of claim 48, wherein the characterization module is to detect a power swing in the electrical power system between the first location in the electrical power system and the second location in the electrical power system using the angle difference, the slip frequency, and the acceleration.

51. The system of claim 50, wherein the characterization module is to compare an absolute value of the slip frequency to a first slip frequency threshold, to compare an absolute value of the acceleration to a first acceleration threshold, and to detect a power swing if the absolute value of the slip frequency is greater than the first slip frequency threshold and the absolute value of the acceleration is greater than the first acceleration threshold.

52. The system of claim 51, wherein the characterization module is to compare the absolute value of the slip frequency to a second slip frequency threshold and to compare the absolute value of the acceleration to a second acceleration threshold, and is to detect a power swing if the absolute value of the slip frequency is greater than the first slip frequency threshold and less than the second slip frequency threshold, and the absolute value of the acceleration is greater than the first acceleration threshold and less than the second acceleration threshold.

53. The system of claim 52, wherein the first slip frequency threshold is 0.2 Hz, the second slip frequency threshold is 10 Hz, the first acceleration threshold is 0.1 Hz/second, and the second acceleration threshold is 50 Hz/second.

54. The system of claim 52, wherein the first slip frequency threshold, the second slip frequency threshold, the first acceleration threshold, and the second acceleration threshold are determined using one selected from the group consisting of characteristics of the electrical power system, modeling of the electrical power system, and testing of the electrical power system.

55. The system of claim 52, wherein the characterization module is to detect a power swing only if the absolute value of the slip frequency is maintained greater than the first slip frequency threshold and less than the second slip frequency threshold, and the absolute value of the acceleration is maintained greater than the first acceleration threshold and less than the second acceleration threshold for one of a predetermined time period, predetermined number of voltage measurements, and predetermined number of clock cycles.

56. The system of claim 48, wherein the characterization module is to predicatively detect an out-of-step (OOS) condition in the power system using the angle difference, the slip frequency, and the acceleration.

57. The system of claim 56, wherein the characterization module is to predicatively detect the OOS condition by comparing an operating point determined by the slip frequency and the acceleration against the OOS characteristic, and the OOS characteristic comprises a predictive OOS characteristic, and to detect an OOS condition if the operating point is outside of the predictive OOS characteristic.

58. The system of claim 57, wherein the predictive OOS characteristic comprises a sum of an acceleration offset value and a product of the slip frequency and an OOS slope constant.

59. The system of claim 58, wherein the acceleration offset value and the OOS slope constant are determined using one selected from the group consisting of characteristics of the electrical power system, modeling of the electrical power system, and testing of the electrical power system.

60. The system of claim 58, wherein the characterization module is to predicatively detect an OOS condition in the electrical power system if the operating point is maintained outside of the predictive OOS characteristic for one of a predetermined time period, predetermined number of phase voltage measurements, and predetermined number of clock cycles.

61. The system of claim 33, wherein the first IED is communicatively coupled approximate to a sending-end generator equivalent of the electrical power system.

62. The system of claim 61, wherein the second IED is communicatively coupled approximate to a receiving-end generator equivalent of the electrical power system.

63. A non-transitory computer-readable storage medium comprising instructions to cause a computing device to perform a method for monitoring an electrical power system, the method comprising:
receiving a plurality of first voltage measurements from a first intelligent electronic device (IED) communicatively coupled to a first location in the electrical power system to obtain voltage measurements therefrom, wherein the first location is approximate to a sending-end generator equivalent of the electrical power system;
receiving a plurality of second voltage measurements from a second IED communicatively coupled to a location in the electrical power system to obtain voltage measurements therefrom, wherein the second location is approximate to a receiving-end generator equivalent of the electrical power system;
time aligning the first plurality of voltage measurements and the second plurality of voltage measurements;
calculating an angle difference between the first time aligned voltage measurements and the second time aligned voltage measurements:
calculating a slip frequency using the angle difference;
calculating an acceleration using the slip frequency;
detecting an out-of-step (OOS) condition in the electrical power system using the angle difference;
detecting a power swing in the electrical power system using the angle difference, the slip frequency, and the acceleration; and
predicatively detecting an OOS condition in the electrical power system using the slip frequency and the acceleration by:
determining an operating point comprising the slip frequency and the acceleration:
detecting an out-of-step (OOS) condition by comparing the operating point against an OOS characteristic.

64. The non-transitory computer-readable storage medium of claim 63, wherein detecting an OOS condition comprises:
comparing the angle difference to an out-of-step threshold (OOSTH);
comparing the angle difference to a negative OOSTH; and
detecting an OOS condition if the angle difference is greater than the OOSTH or less than the negative OOSTH.

65. The non-transitory computer-readable storage medium of claim 63, wherein detecting a power swing using the angle difference, the slip frequency, and the acceleration comprises:
comparing an absolute value of the slip frequency to a first slip frequency threshold and a second slip frequency threshold;
comparing an absolute value of the acceleration to a first acceleration threshold and a second acceleration threshold; and
detecting a power swing if the absolute value of the slip frequency is greater than the first slip frequency threshold and less than the second slip frequency threshold and the absolute value of the acceleration is greater than the first acceleration threshold and less than the second acceleration threshold.

\* \* \* \* \*